(12) United States Patent
Saeki et al.

(10) Patent No.: US 7,837,425 B2
(45) Date of Patent: Nov. 23, 2010

(54) TRANSPORTATION APPARATUS AND DRIVE MECHANISM

(75) Inventors: Hiroaki Saeki, Nirasaki (JP); Shigeru Ishizawa, Nirasaki (JP); Takehiro Shindo, Nirasaki (JP); Tsutomu Hiroki, Nirasaki (JP); Wataru Machiyama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 962 days.

(21) Appl. No.: 10/564,618

(22) PCT Filed: Jul. 9, 2004

(86) PCT No.: PCT/JP2004/010178

§ 371 (c)(1),
(2), (4) Date: Jan. 13, 2006

(87) PCT Pub. No.: WO2005/008769

PCT Pub. Date: Jan. 27, 2005

(65) Prior Publication Data

US 2006/0210387 A1 Sep. 21, 2006

(30) Foreign Application Priority Data

Jul. 16, 2003 (JP) .............................. 2003-197689
Jan. 16, 2004 (JP) .............................. 2004-009506

(51) Int. Cl.
*B25J 18/02* (2006.01)
(52) U.S. Cl. .................... 414/744.5; 901/15; 74/490.01
(58) Field of Classification Search ............. 414/744.5; 74/490.01, 490.03, 490.05; 901/15
See application file for complete search history.

(56) References Cited

U.S. PATENT DOCUMENTS

| | | | | |
|---|---|---|---|---|
| 5,151,008 A | * | 9/1992 | Ishida et al. | 414/744.5 |
| 5,899,658 A | | 5/1999 | Hofmeister | |
| 6,485,250 B2 | * | 11/2002 | Hofmeister | 414/744.1 |
| 6,705,177 B2 | * | 3/2004 | Okuno et al. | 74/490.01 |

FOREIGN PATENT DOCUMENTS

| | | |
|---|---|---|
| JP | 10-156770 | 6/1996 |
| JP | 8-506771 | 7/1996 |
| JP | 9-262788 | 10/1997 |
| JP | 2000-072248 | 3/2000 |
| JP | 2002-361577 | 12/2002 |

* cited by examiner

*Primary Examiner*—Donald Underwood
(74) *Attorney, Agent, or Firm*—Oblon, Spivak, McClelland, Maier & Neustadt, L.L.P.

(57) ABSTRACT

A transfer apparatus (20) for a target substrate (W) includes a rotatable rotary base (24). First and second arm mechanisms (26, 28) are attached to the rotary base and configured to bend and stretch. Each of the first and second arm mechanisms has a proximal end arm (26A, 28A), an intermediate arm (26B, 28B), and a pick (26C, 28C) which are pivotally coupled to each other sequentially from the rotary base. The picks are disposed to support the target substrate. A link mechanism (30) is coupled to the proximal end arms of the first and second arm mechanisms to drive the first and second arm mechanisms. A first driving source (32) is disposed to rotatably drive the rotary base. A second driving source (34) is disposed to drive the link mechanism so as to bend or stretch the first and second arm mechanisms.

29 Claims, 25 Drawing Sheets

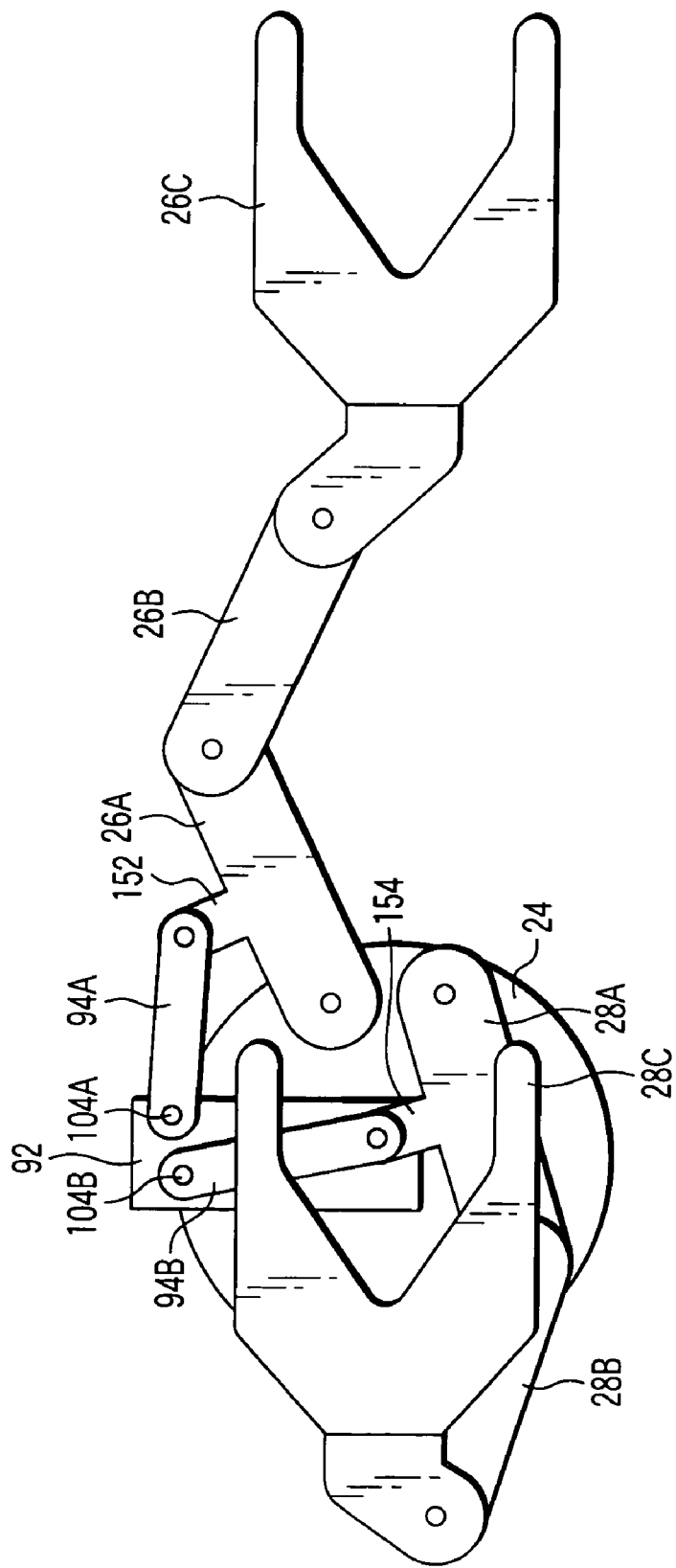
F I G. 18

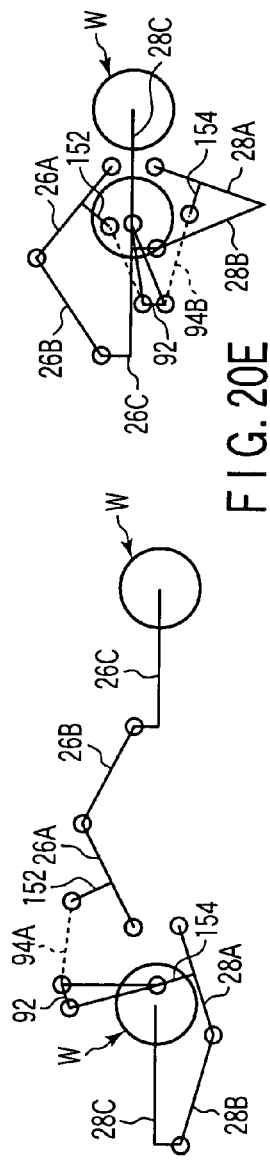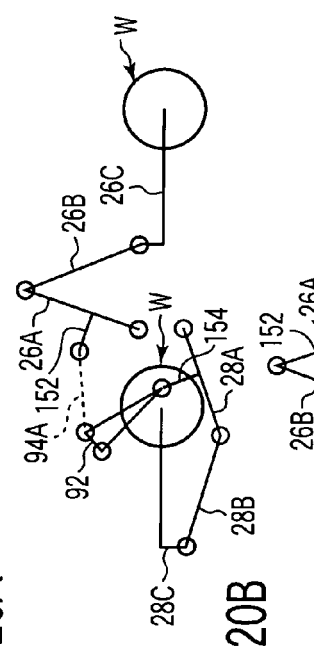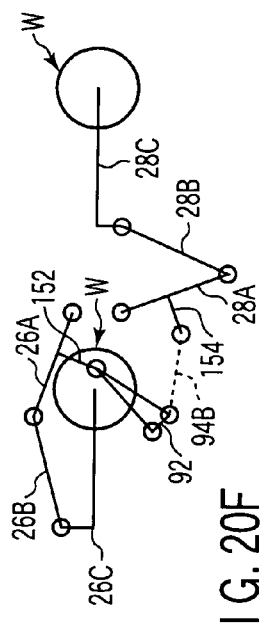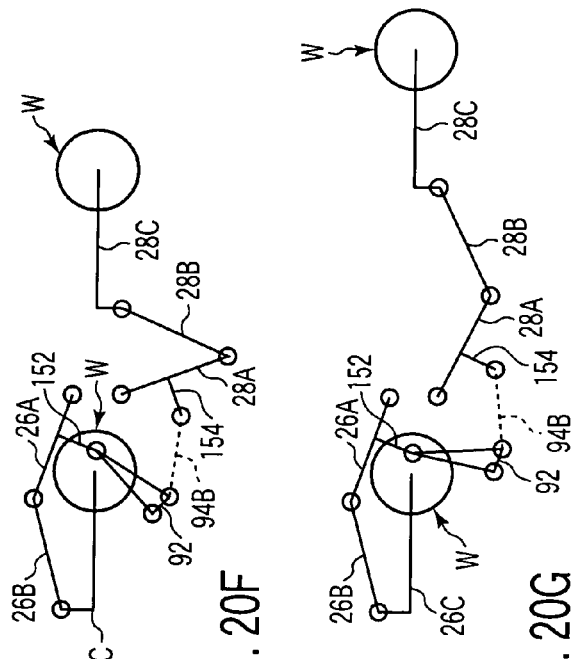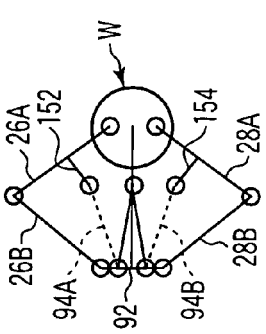
F I G. 20A F I G. 20B F I G. 20C F I G. 20D F I G. 20E F I G. 20F F I G. 20G

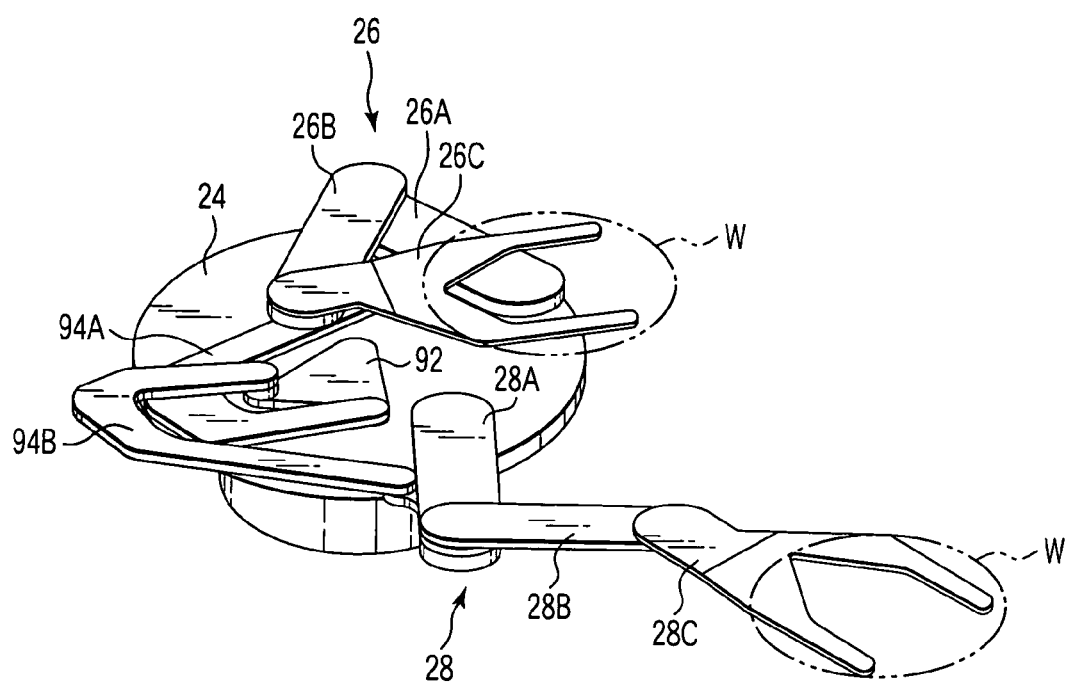
F I G. 23

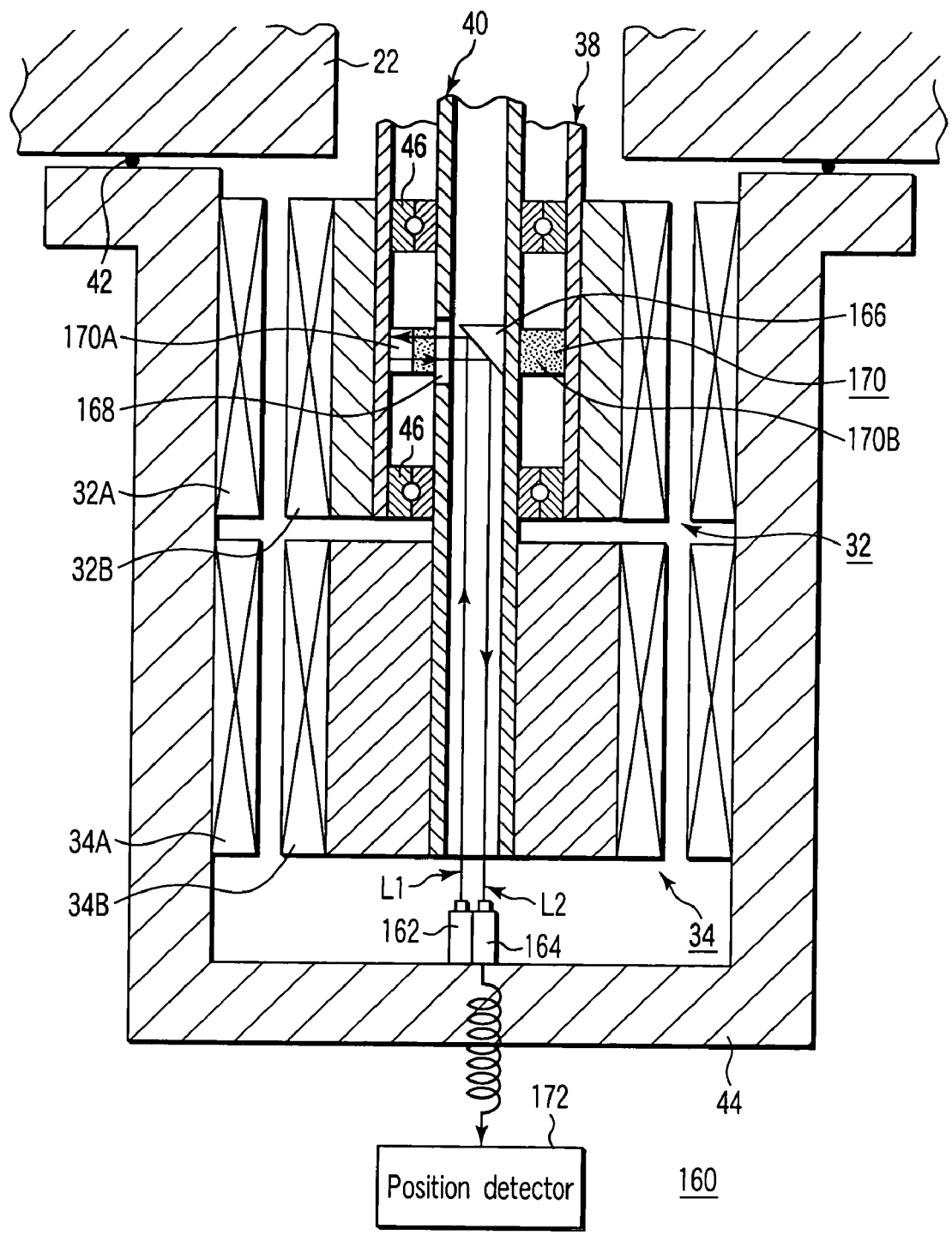
F I G. 26

TRANSPORTATION APPARATUS AND DRIVE MECHANISM

TECHNICAL FIELD

The present invention relates to a transfer apparatus and driving mechanism and, more particularly, to a transfer apparatus and driving mechanism which are used in a semiconductor processing system. Semiconductor processes refer to various types of processes performed to form a semiconductor layer, insulating layer, conductive layer, and the like on a target substrate such as a wafer or a glass substrate, e.g., an LCD (Liquid crystal display) or FPD (Flat Panel Display) with a predetermined pattern to manufacture on the target substrate a semiconductor device or a structure including a wiring, electrode, and the like to be connected to the semiconductor device.

BACKGROUND ART

In the semiconductor processing system which manufactures a semiconductor device and the like, the target substrate such as a semiconductor wafer is transferred. For example, the wafer is transferred through a clean atmosphere under atmospheric pressure or vacuum pressure and loaded into a process chamber. Further, the wafer is inversely unloaded from the process chamber and transferred to a predetermined location. A transfer apparatus to transfer the semiconductor wafer is disclosed in, e.g., the following patent documents 1 to 4.

FIG. 33 is a perspective view showing an example of a conventional transfer apparatus of the same type as that of the apparatuses disclosed in patent documents 1 and 3. A transfer apparatus 2 has an arm 8 obtained by coupling a proximal end arm 4 and intermediate arm 6, so that it can bend and stretch. A pick arm 10 is pivotally attached to the distal end of the arm 8. Pick portions 10A and 10B are formed at the two ends of the pick arm 10. The entire arm 8 can rotate integrally. When the arm 8 is bent or stretched, the driving force is transmitted by a pulley incorporated in the arm 8 and a coupling belt to retreat or advance the pick arm 10 in a predetermined direction.

Two motors (not shown) are disposed in a motor source 12 which drives the transfer apparatus 2. The first motor rotates the entire arm 8 as described above to face it in a desired direction. The second motor bends or stretches the arm 8 as described above.

When the transfer apparatus 2 is used, semiconductor wafers W in the process chamber can be exchanged in the following manner. More specifically, first, one pick of the pick arm 10, e.g., the pick portion 10A, is emptied, and an unprocessed wafer W is held by the other pick portion 10B. Subsequently, the arm 8 is bent or stretched to unload a processed wafer W from the process chamber. Then, the empty pick portion 10A is advanced into the process chamber to receive the processed wafer W. The pick portion 10A is then retreated to unload the processed wafer W from the process chamber.

Subsequently, with the arm 8 being folded as shown in FIG. 33, the entire arm is rotated through 180° to direct the pick portion 10B which holds the unprocessed wafer W toward the process chamber. The arm 8 is then bent or stretched again to load the unprocessed wafer into the process chamber. At this time, the pick portion 10B is advanced to load the unprocessed wafer held by the pick portion 10B into the process chamber. The emptied pick portion 10B is retreated, thus completing the transfer operation.

The following patent documents 2 and 4 disclose other types of transfer apparatuses. In each of these transfer apparatuses, a pair of picks each for holding a wafer are arranged not in one horizontal plane but to overlap vertically, unlike in patent documents 1 and 3, and are set to face the same direction. Three motors are used as a driving source to pivot the entire apparatus and advance and retreat the respective picks.

[Patent document 1] U.S. Pat. No. 5,899,658
[Patent document 2] Jpn. Pat. Applin. KOKAI Publication No. 2000-72248
[Patent document 3] Jpn. Pat. Applin. KOKAI Publication No. 7-142551
[Patent document 4] Jpn. Pat. Applin. KOKAI Publication No. 10-163296

The transfer apparatuses shown in FIG. 33, patent documents 1 and 3, and the like have the following problems. To exchange a processed wafer and unprocessed wafer in the process chamber, the pick arm 10 must be pivoted through 180°. This large pivot angle leads to a waste of time and accordingly swift exchange operation cannot be performed. In particular, as the wafer size increases from a diameter of 200 mm to 300 mm, the wafer weight increases, so the pivot speed cannot be increased. Further, when the arm 8 extends and contracts, either one pick always holds a wafer. Thus, the extending/contracting speed of the arm 8 cannot be increased very much. In each of the transfer apparatuses disclosed in patent documents 2 and 4, three motors are necessary as a driving source, and the apparatus cost rises accordingly.

DISCLOSURE OF INVENTION

It is an object of the present invention to provide a transfer apparatus in which a small pivot angle of the base suffices when exchanging target substrates.

It is another object of the present invention to provide a transfer apparatus in which the number of motors serving as a driving source can be decreased to decrease the apparatus cost and the entire weight.

It is a further object of the present invention to provide a driving mechanism which can detect a positional relationship among a plurality of driving shafts relative to each other without using an encoder or the like.

According to a first aspect of the present invention, there is provided a transfer apparatus for a target substrate, comprising a rotatable rotary base, first and second flexible arm mechanisms attached to the rotary base and configured to bend and stretch, each of the first and second arm mechanisms comprising a proximal end arm, an intermediate arm, and a pick which are pivotally coupled to each other sequentially from the rotary base, and the picks being disposed to support the target substrate, a link mechanism coupled to the proximal end arms of the first and second arm mechanisms to drive the first and second arm mechanisms, a first driving source configured to rotatably drive the rotary base, and a second driving source configured to drive the link mechanism so as to bend or stretch the first and second arm mechanisms.

According to a second aspect of the present invention, there is provided a driving mechanism having a function of detecting a rotational position, comprising hollow pipe inner and outer driving shafts which are coaxial and rotatable, a plurality of driving sources connected to each of the inner and outer driving shafts, a detection pattern disposed on an inner surface of the outer driving shaft, a light-transmitting window disposed on the inner driving shaft so as to receive reflected light from the detection pattern, a reflection member configured to reflect the light passing through the light-transmitting window in an axial direction of the inner driving shaft, a light-receiving portion which receives the light reflected by the reflection member, and a position detector configured to obtain a positional relationship in a rotational direction between the inner and outer driving shafts based on an output from the light-receiving portion.

The driving mechanism according to the second aspect can be incorporated as the driving mechanism of the transfer apparatus according to the first aspect.

BRIEF DESCRIPTION OF DRAWINGS

FIG. 18 is a plan view showing a state of the transfer apparatus shown in FIG. 17 wherein one arm mechanism is extended;

FIGS. 20A to 20G are views schematically showing a series of operating states of the transfer apparatus shown in FIG. 17;

FIG. 23 is a perspective view showing a state of the transfer apparatus shown in FIG. 22 wherein one arm mechanism is extended;

FIG. 26 is an enlarged sectional view showing a driving mechanism according to an embodiment of the present invention;

BEST MODE FOR CARRYING OUT THE INVENTION

Figure 1:
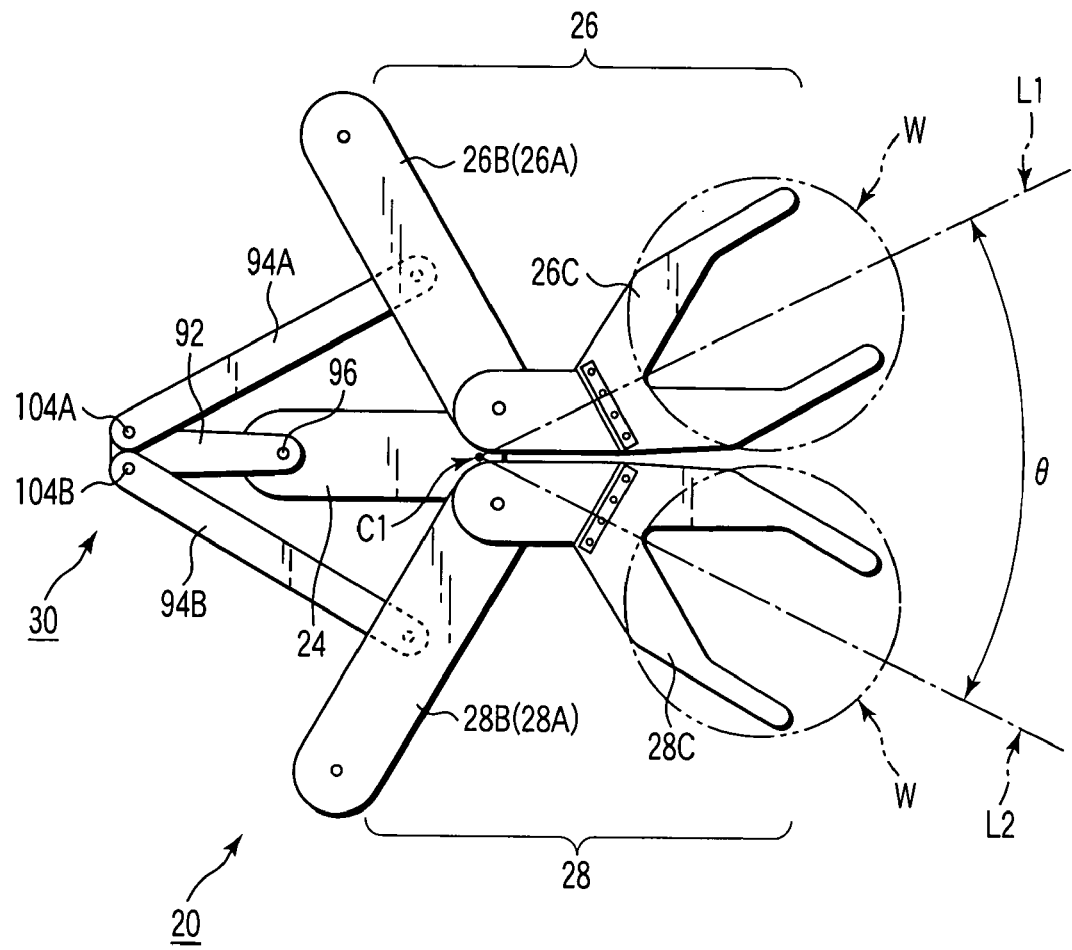
FIG. 1 is a plan view showing a state of a transfer apparatus according to a first embodiment of the present invention wherein two arm mechanisms are contracted.

Embodiments of the present invention will be described with reference to the drawings. In the following description, constituent elements having substantially the same function and arrangement are denoted by the same reference numerals, and a repetitive description will be made only when it is necessary.

First Embodiment

Figure 3:
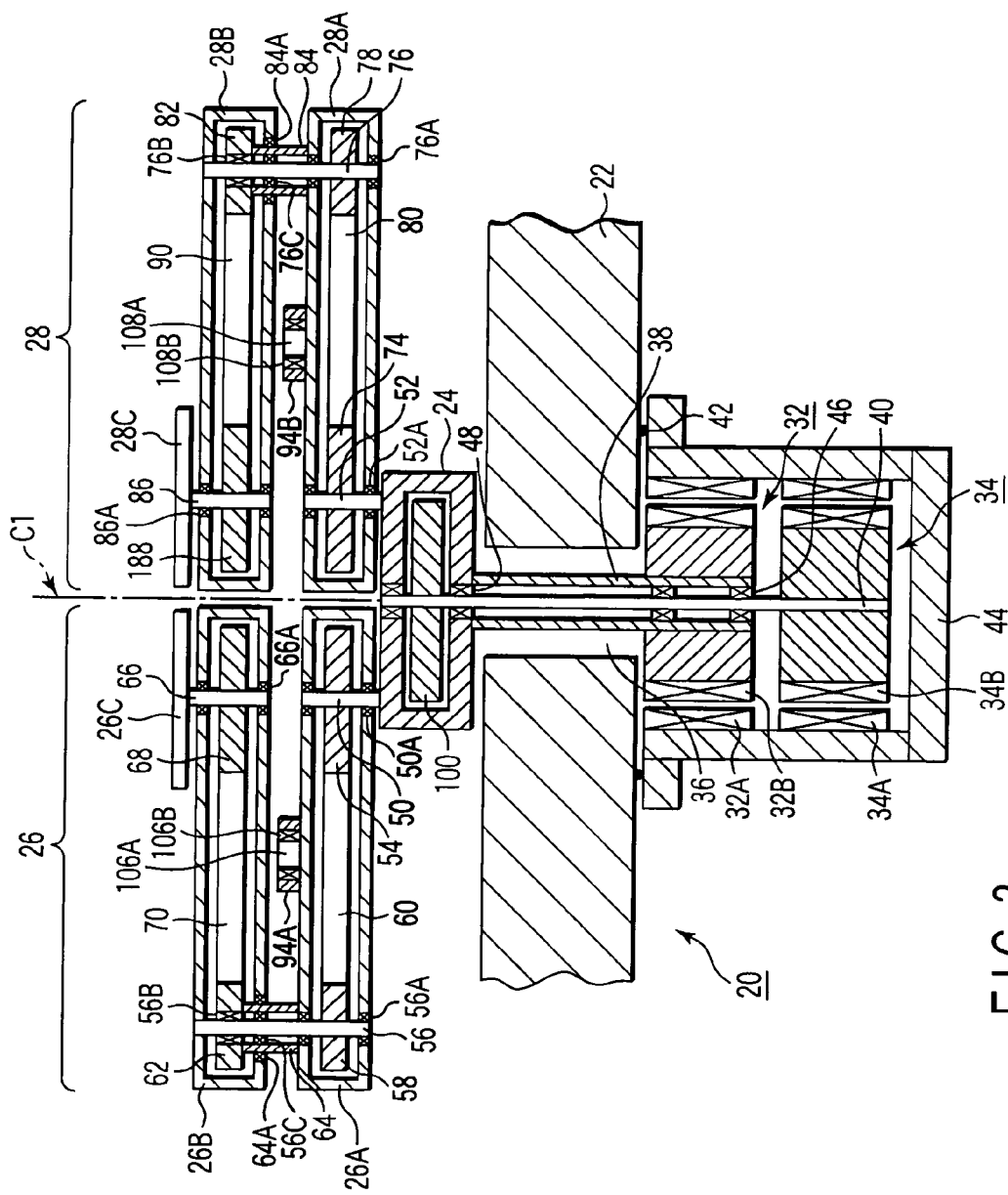
FIG. 3 is a sectional view showing the transfer apparatus shown in FIG. 1.

FIG. 1 is a plan view showing a state of a transfer apparatus according to a first embodiment of the present invention wherein two arm mechanisms are contracted. FIG. 3 is a sectional view showing the transfer apparatus shown in FIG. 1.

A transfer apparatus 20 incorporates a rotary base 24 rotatably supported by a base 22 (see FIG. 3). A pair of arm mechanisms, i.e., a first arm mechanism 26 and a second arm mechanism 28, are supported by the rotary base 24, so that they can pivot, bend, and stretch. A link mechanism 30 is disposed to selectively bend or stretch the first and second arm mechanisms 26 and 28. A first driving source 32 (see FIG. 3) is disposed to rotatably drive the rotary base 24. A second driving source 34 (see FIG. 3) is disposed to drive the link mechanism 30 to swingably pivot, so as to bend or stretch the first and second arm mechanisms 26 and 28.

The base 22 is formed of the bottom plate or the like of a transfer chamber which is disposed in, e.g., a cluster tool type semiconductor processing system. The interior of the transfer chamber is maintained in a vacuum state, and a plurality of process chambers (not shown) are connected to the transfer chamber to surround it. Driving shafts 38 and 40 which are coaxial are inserted in a through hole 36 formed in the base 22. A motor box 44 comprising a hollow box is hermetically attached to the lower surface of the base 22 through a seal member 42 such as an O-ring. The motor box 44 accommodates the first and second driving sources 32 and 34.

The first and second driving sources 32 and 34 comprise, e.g., stepping motors (pulse motors), and are constituted by a stator 32A and a rotor 32B, and a stator 34A and a rotor 34B, respectively. The rotor 32B of the first driving source 32 is coupled to the hollow (pipe-like) outer driving shaft 38. The rotor 34B of the second driving source is coupled to the inner driving shaft 40. A bearing 46 is interposed between the two driving shafts 38 and 40 to rotatably support them. The outer driving shaft 38 is rotatably supported on the base 22 side through a bearing (not shown) which uses a magnetic fluid seal. The first and second driving sources 32 and 34, the two driving shafts 38 and 40, and the like constitute part of a driving mechanism (to be described later).

The rotary base 24 is disposed at the upper end portions of the two driving shafts 38 and 40. The rotary base 24 has a predetermined width and a hollow interior to extend radially (horizontally) by a predetermined length. The upper end of the outer driving shaft 38 is directly coupled and fixed to the rotary base 24. The driving shaft 38 and rotary base 24 rotate integrally. The upper portion of the inner driving shaft 40 extends through the rotary base 24. The driving shaft 40 is supported on the rotary base 24 through a bearing 48, so the driving shaft 40 and rotary base 24 are rotatable. Accordingly, the inner driving shaft 40 serves as a pivot center C1 of the entire transfer apparatus. Two fixed shafts 50 and 52 are attached and fixed upright to the upper surface of the proximal end portion side of the rotary base 24 to be spaced apart from each other by a predetermined distance. The first and second arm mechanisms 26 and 28 are rotatably attached to the fixed shafts 50 and 52, respectively.

The first arm mechanism 26 mainly comprises a hollow proximal end arm 26A, a hollow intermediate arm 26B, and a pick 26C on which a wafer W is to be actually placed and held. The proximal end portion of the proximal end arm 26A is rotatably supported by the fixed shaft 50 through a bearing 50A. A large pulley 54 is fixed to the fixed shaft 50 to be integral with it.

A rotary shaft 56 is disposed to extend upward in the distal end portion of the proximal end arm 26A to be rotatable through a bearing 56A. A small pulley 58 is fixed to the rotary shaft 56 and rotates together with it. A coupling belt 60 is looped between the small pulley 58 and large pulley 54 to transmit power. The ratio in diameter of the small pulley 58 to the large pulley 54 is 1:2. The small pulley 58 rotates with a rotation angle twice that of the large pulley 54.

The upper end portion of the rotary shaft 56 is disposed to extend through the proximal end portion of the intermediate arm 26B. The upper end of the rotary shaft 56 is fixed to the upper surface of the intermediate arm 26B. The intermediate arm 26B rotates together with the rotary shaft 56. The rotary shaft 56 rotatably supports a small pulley 62 through a bearing 56B. The small pulley 62 is fixed to the upper end of a hollow fixed shaft 64. The rotary shaft 56 extends in the fixed shaft 64 to be coaxial with it. The fixed shaft 64 has a predetermined length, and extends downward through the intermediate arm 26B. The lower end of the fixed shaft 64 is fixed to the upper surface of the proximal end arm 26A to be integral with it. A bearing 56C is interposed between the rotary shaft 56 and fixed shaft 64. The fixed shaft 64 is rotatably supported by the intermediate arm 26B through a bearing 64A.

A rotary shaft 66 is rotatably supported at the distal end portion of the intermediate arm 26B through a bearing 66A. The upper end portion of the rotary shaft 66 extends upward to project externally. The proximal end portion of the pick 26C is disposed to be fixed to the upper end portion of the projecting rotary shaft 66. A large pulley 68 is fixed to the rotary shaft 66. A coupling belt 70 is looped between the large pulley 68 and small pulley 62 to transmit power. The ratio in diameter of the small pulley 62 to the large pulley 68 is 1:2. The large pulley 68 rotates with a rotation angle ½ time that of the small pulley 62. Thus, while the rotary base 24 is stationary, when the first arm mechanism 26 is bent or stretched by using the link mechanism 30 as will be described later, the pick 26C retreats and advances in one direction.

The second arm mechanism 28 has the same arrangement as that of the first arm mechanism 26 except that it is axial-symmetrical. More specifically, the second arm mechanism 28 mainly comprises a hollow proximal end arm 28A, a hollow intermediate arm 28B, and a pick 28C on which a wafer W is to be actually placed and held. The proximal end portion of the proximal end arm 28A is rotatably supported by the fixed shaft 52 through a bearing 52A. A large pulley 74 is fixed to the fixed shaft 52 to be integral with it.

A rotary shaft 76 is disposed to extend upward in the distal end portion of the proximal end arm 28A to be rotatable through a bearing 76A. A small pulley 78 is fixed to the rotary shaft 76 and rotates together with it. A coupling belt 80 is looped between the small pulley 78 and large pulley 74 to transmit power. The ratio in diameter of the small pulley 78 to the large pulley 74 is 1:2. The small pulley 78 rotates with a rotation angle twice that of the large pulley 74.

The upper end portion of the rotary shaft 76 is disposed to extend through the proximal end portion of the intermediate arm 28B. The upper end of the rotary shaft 76 is fixed to the upper surface of the intermediate arm 28B. The intermediate arm 28B rotates together with the rotary shaft 76. The rotary shaft 76 rotatably supports a small pulley 82 through a bearing 76B. The small pulley 82 is fixed to the upper end of a hollow fixed shaft 84. The rotary shaft 76 extends in the fixed shaft 84 to be coaxial with it. The fixed shaft 84 has a predetermined length. The fixed shaft 84 extends downward through the intermediate arm 28B. The lower end of the fixed shaft 84 is fixed to the upper surface of the proximal end arm 28A to be integral with it. A bearing 76C is interposed between the rotary shaft 76 and fixed shaft 84. The fixed shaft 84 is rotatably supported by the intermediate arm 28B through a bearing 84A.

A rotary shaft 86 is rotatably supported at the distal end portion of the intermediate arm 28B through a bearing 86A. The upper end portion of the rotary shaft 86 extends upward to project externally. The proximal end portion of the pick 26C is disposed to be fixed to the upper end portion of the projecting rotary shaft 86. A large pulley 88 is fixed to the rotary shaft 86. A coupling belt 90 is looped between the large pulley 88 and small pulley 82 to transmit power. The ratio in diameter of the small pulley 82 to the large pulley 88 is 1:2. The large pulley 88 rotates with a rotation angle ½ time that of the small pulley 82. Thus, while the rotary base 24 is stationary, when the second arm mechanism 28 is bent or stretched by using the link mechanism 30 as will be described later, the pick 28C retreats and in one direction.

As is apparent from FIG. 1, the two picks 26C and 28C are arranged on one plane (horizontal plane). The respective picks 26C and 28C advance in different directions, and an open angle θ defined by them is set to, e.g., about 60°, although depending on the size of the wafer W. The open angle θ is set within a range of, e.g., 60° to 180° (exclusive) such that the wafers do not interfere.

Figure 4:
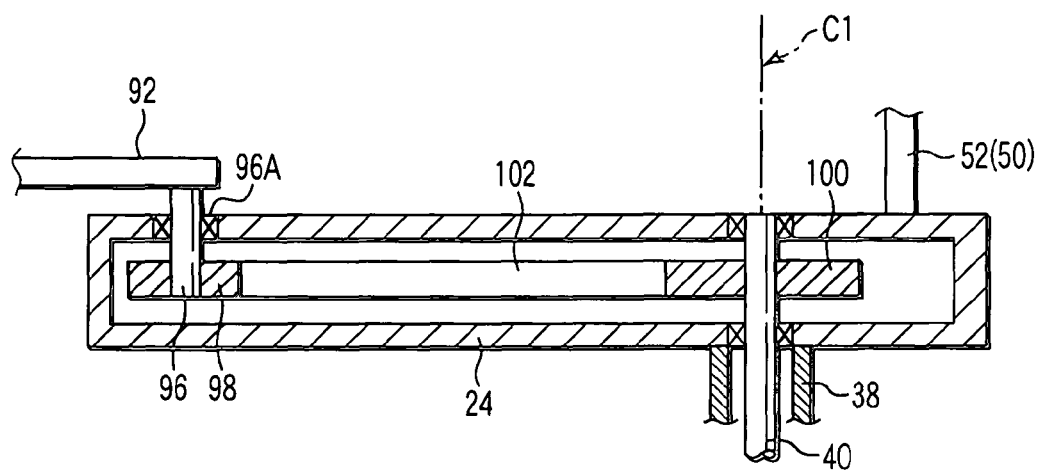
FIG. 4 is a sectional view showing the internal structure of a rotary base in the transfer apparatus shown in FIG. 1.

As shown in FIG. 1, the link mechanism 30 mainly comprises a driving link 92 and two driven links 94A and 94B. The driving link 92 is pivotally driven by the second driving source 34 (see FIG. 3). The driven links 94A and 94B are coupled to the driving link 92. The driving link 92 is pivotally supported by the rotary base 24. FIG. 4 is a sectional view showing the internal structure of the rotary base 24 in the transfer apparatus shown in FIG. 1.

As shown in FIG. 4, a rotary shaft 96 is rotatably disposed at the distal end portion of the rotary base 24 through a bearing 96A. A driven pulley 98 is fixed around the rotary shaft 96. A driving pulley 100 is fixed around the driving shaft 40 in the rotary base 24. A coupling belt 102 is looped between the driving pulley 100 and driven pulley 98 to transmit the power of the second driving source 34. In other words, the driving pulley 100, driven pulley 98, and coupling belt 102 form a power transmission mechanism.

The upper end portion of the rotary shaft 96 projects upward from the rotary base 24. The proximal end portion of the driving link 92 is coupled to the upper end portion of the rotary shaft 96, so the driving link 92 and rotary shaft 96 rotate integrally. Therefore, when the driving shaft 40 is rotated clockwise and counterclockwise, the driving link 92 also pivots clockwise and counterclockwise. The driving link 92 has a predetermined length. The proximal end portions of the two driven links 94A and 94B are rotatably disposed at the distal end portion of the driving link 92 side by side through respective support pins 104A and 104B and bearings (not shown). The driven links 94A and 94B have predetermined lengths.

The distal end portion of one driven link 94A is rotatably coupled to the upper surface at the central portion of the proximal end arm 26A of the first arm mechanism 26 through a support pin 106A and a bearing 106B (see FIG. 3). The distal end portion of the other driven link 94B is rotatably coupled to the upper surface at the central portion of the proximal end arm 28A of the second arm mechanism 28 through a support pin 108A and a bearing 108B (see FIG. 3).

Figure 2:
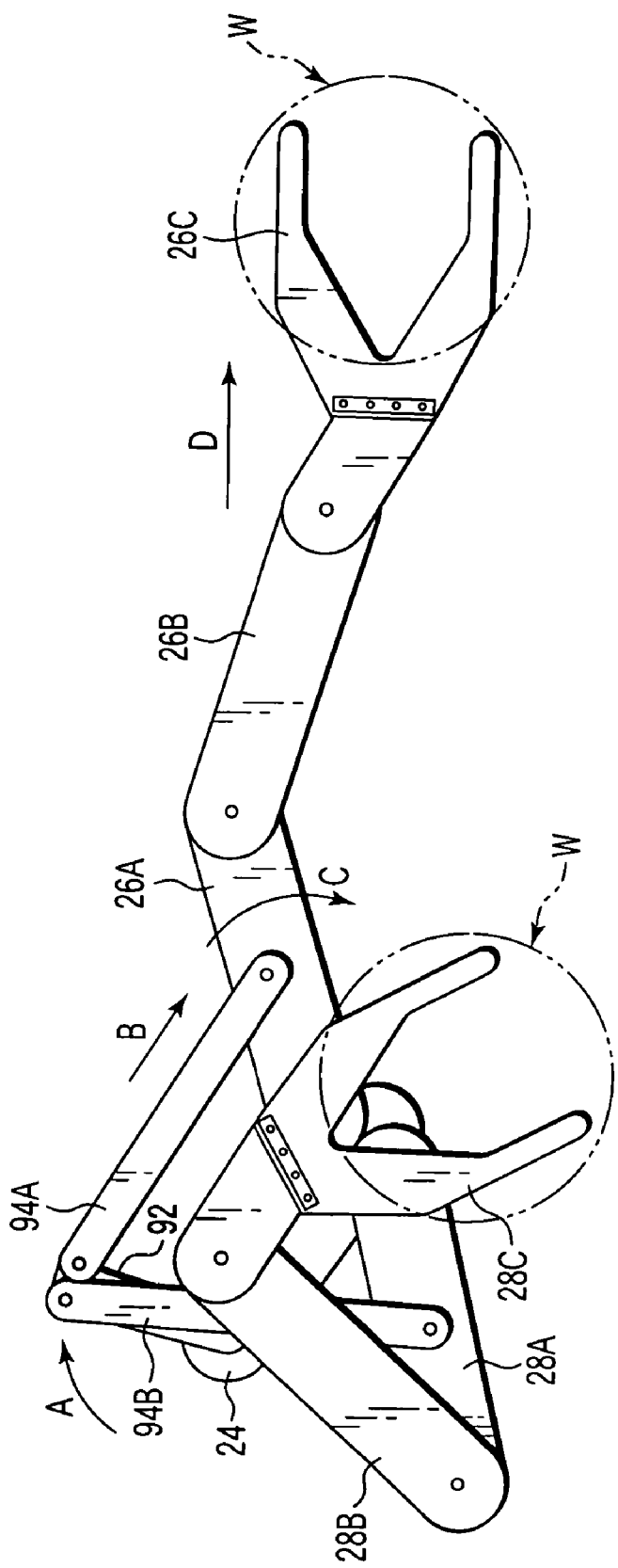
FIG. 2 is a plan view showing a state of the transfer apparatus shown in FIG. 1 wherein one arm mechanism is extended.

Thus, when the driving link 92 is rotated, the transfer apparatus operates as shown in, e.g., FIG. 2. FIG. 2 is a plan view showing a state of the transfer apparatus shown in FIG. 1 wherein one arm mechanism is extended. More specifically, when the driving link 92 is rotated through a predetermined angle in one direction, one pick 26C advances largely, while the other pick 28C retreats only by a short distance. When the driving link 92 is rotated through a predetermined angle in the other direction, the respective picks 26C and 28C operate in the opposite manner to that described above. More specifically, when the link mechanism 30 is rotated clockwise and counterclockwise, the first and second arm mechanisms 26 and 28 are bent or stretched selectively.

The operation of the first embodiment having the above arrangement will be described.

First, when the transfer apparatus 20 is to be set in a predetermined direction, the first and second driving sources 32 and 34 shown in FIG. 3 are rotated in synchronism with each other. Then, the rotary base 24 pivots to face in a predetermined direction. The first and second arm mechanisms 26 and 28 in the folded state (contracted state) thus face in predetermined directions.

Subsequently, one pick, e.g., the pick 26C, is extended and advanced as shown in FIG. 2. For this purpose, with the first driving source 32 being stopped, the second driving source 34 is rotated in a predetermined direction through a predetermined angle or at a predetermined rotational amount. The rotational driving force is transmitted to the rotary shaft 96 to rotate it through the driving shaft 40, driving pulley 100, coupling belt 102, and driven pulley 98.

At this time, the driving link 92 of the link mechanism 30 which is integrally coupled to the rotary shaft 96 rotates as indicated by an arrow A in FIG. 2. Accordingly, the driven link 94A connected to the driving link 92 is pushed out obliquely as indicated by an arrow B. The distal end portion of the driven link 94A is coupled to the proximal end arm 26A of the first arm mechanism 26. The proximal end arm 26A rotates about the fixed shaft 50 (see FIG. 3) as a fulcrum as indicated by an arrow C (see FIG. 2).

Then, the large pulley 54 in the proximal end arm 26A rotates relatively (actually, the large pulley 54 does not but the proximal end arm 26A rotates). This rotational driving force is transmitted to the intermediate arm 26B through the coupling belt 60 and small pulley 58 and then to the rotary shaft 66 through the small pulley 62, coupling belt 70, and large pulley 68. Thus, the proximal end arm 26A, intermediate arm 26B, and pick 26C in the folded state extend as shown in FIG. 2. As a result, the pick 26C advances linearly as indicated by an arrow D while facing in the same direction. Thus, the pick 26C can be inserted in a predetermined process chamber (not shown).

At this time, as is apparent from comparison of FIGS. 1 and 2, the other, second arm mechanism 28 moves to a position retreated backward by a slight distance. When the second driving source 34 is then rotated in the opposite direction, the first arm mechanism 26 contracts via the opposite route to that described above.

To extend the other, second arm mechanism 28 forward, an operation opposite to that described above may be performed. The picks 26C and 28C of the first and second arm mechanisms 26 and 28 advance or retreat respectively along line segments L1 and L2 which extend through a rotation center C1 of the entire apparatus.

The apparatus operates in the above manner. When, e.g., the wafer in the process chamber is to be exchanged, the exchange operation of the wafer W can be performed more swiftly than with the conventional transfer apparatus. More specifically, after a processed wafer W is unloaded, if the entire transfer apparatus 20 is pivoted through the pick open angle θ e.g., 60°, the other pick which holds an unprocessed wafer W can be directed toward the process chamber. With one pick holding the wafer W and the other pick being empty, when the empty pick is to be advanced or retreated, the moving amount of the pick that holds the wafer W is small, as described above. Therefore, even if the empty pick is advanced or retreated at high speed, the wafer W will not drop from the other pick. As a result, the exchange operation of the wafer W can be performed more swiftly.

Second Embodiment

Figure 5:
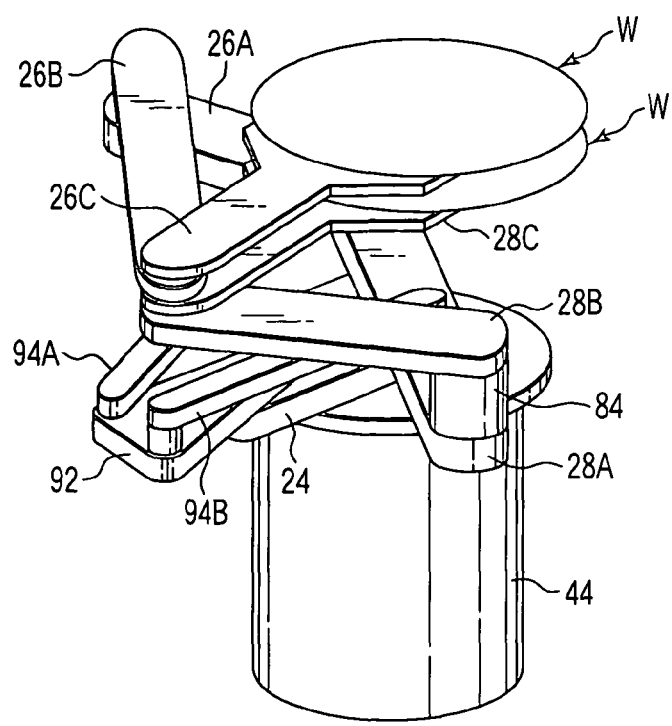
FIG. 5 is a perspective view showing a state of a transfer apparatus according to a second embodiment of the present invention wherein two arm mechanisms are contracted.
Figure 6:
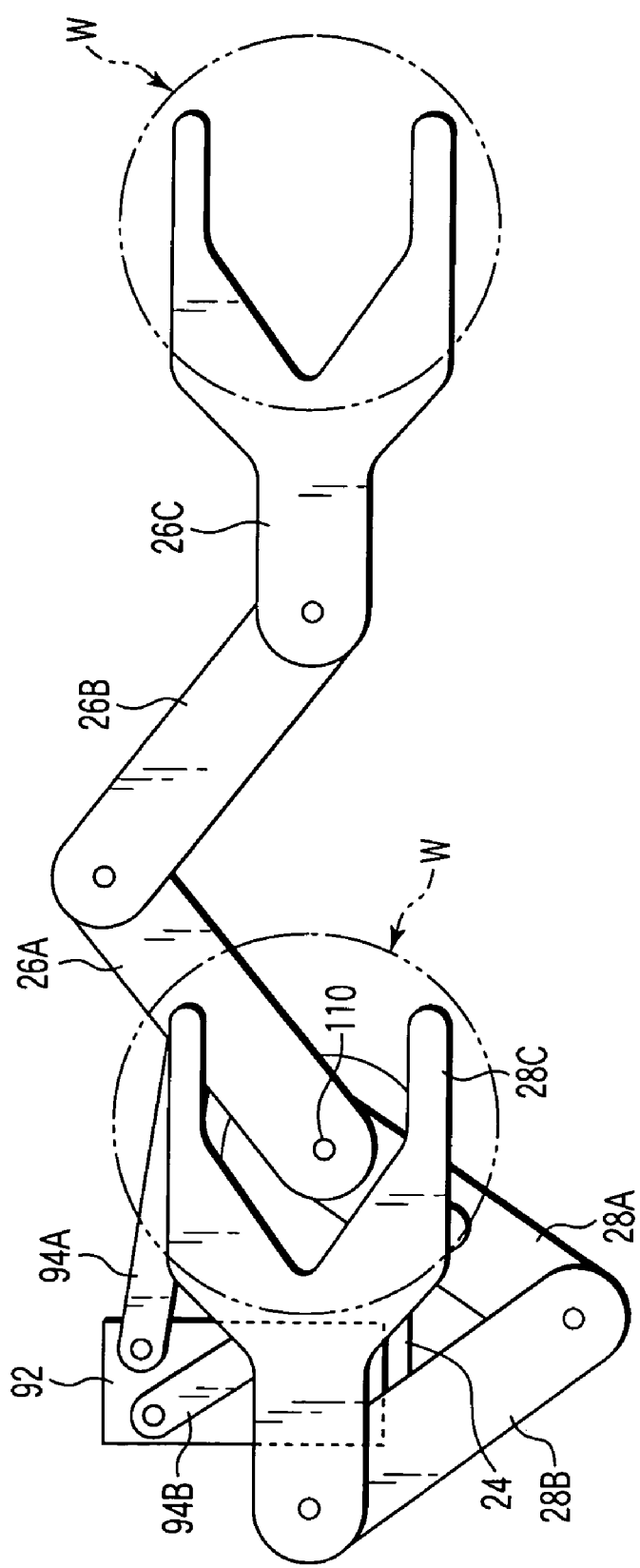
FIG. 6 is a plan view showing a state of the transfer apparatus shown in FIG. 5 wherein one arm mechanism is extended.
Figure 7:
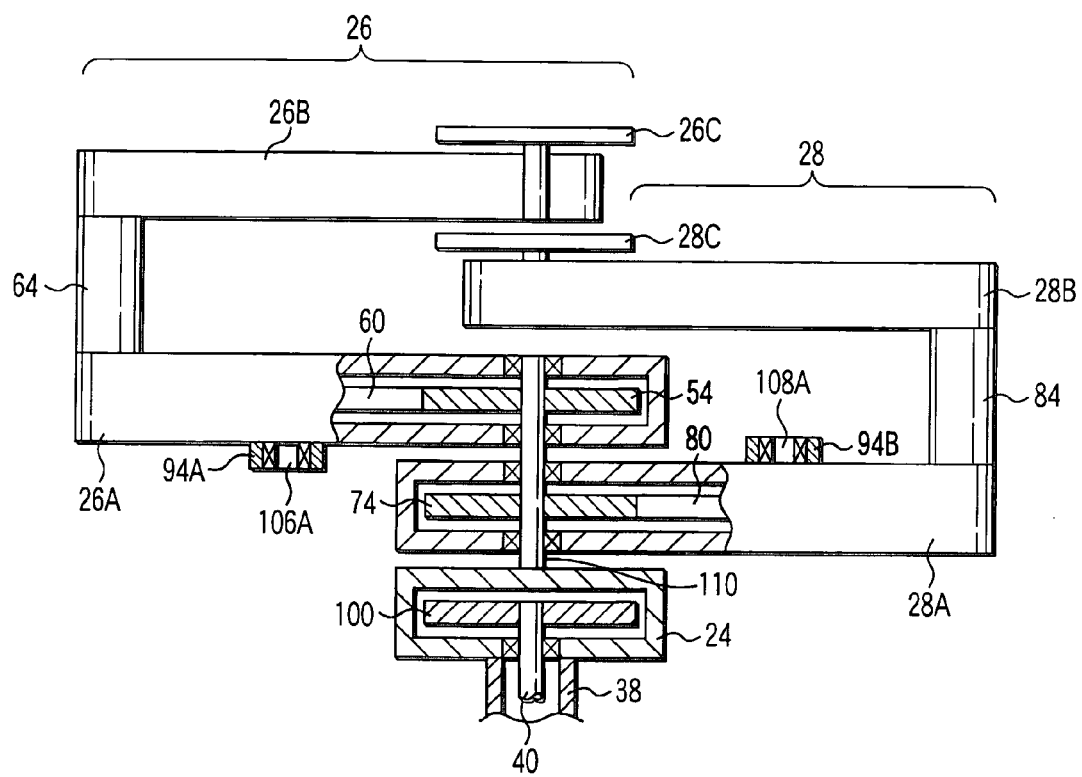
FIG. 7 is a partially cutaway view showing the transfer apparatus shown in FIG. 5.

FIG. 5 is a perspective view showing a state of a transfer apparatus according to a second embodiment of the present invention wherein two arm mechanisms are contracted. FIG. 6 is a plan view showing a state of the transfer apparatus shown in FIG. 5 wherein one arm mechanism is extended. FIG. 7 is a partially cutaway view showing the transfer apparatus shown in FIG. 5.

The second and first embodiments are different in the following respects. Namely, in the first embodiment, the proximal end portions of the first and second arm mechanisms 26 and 28 are supported on the rotary base 24 pivotally by two different shafts, i.e., the fixed shafts 50 and 52, respectively. In the second embodiment, the proximal end portions of first and second arm mechanisms 26 and 28 are pivotally supported by one fixed shaft. In the first embodiment, the picks 26C and 28C are arranged on one plane to face in different directions. In the second embodiment, picks 26C and 28C are overlapped vertically and face in one direction. The state wherein the picks 26C and 28C are overlapped vertically is a structure that is common in other embodiments to be described hereinafter.

As shown in FIG. 7, one fixed shaft 110 is fixed on a rotary base 24 to extend upright. The fixed shaft 110 is longer than each of the fixed shafts 50 and 52 (see FIG. 3) of the first embodiment. In practice, the fixed shaft 110 is disposed to be positionally displaced transversely from a driving shaft 38 which pivots the rotary base 24. This is the same as in the first embodiment.

A large pulley 54 of the first arm mechanism 26 and a large pulley 74 of the second arm mechanism 28 are fixed to one fixed shaft 110 to line up vertically. A proximal end arm 26A of the first arm mechanism 26 and a proximal end arm 28A of the second arm mechanism 28 are disposed about the large pulleys 54 and 74 as the centers. As the first and second arm mechanisms 26 and 28 vertically overlap with each other, they must be prevented from interfering with each other. For this purpose, the lengths of fixed shafts 64 and 84 are set slightly long. The fixed shaft 64 couples the proximal end arm 26A to an intermediate arm 26B. The fixed shaft 84 couples the proximal end arm 28A to an intermediate arm 28B.

According to the first embodiment, the distal end portions of the two driven links 94A and 94B of the link mechanism 30 are rotatably supported on the upper surface sides of the proximal end arms 26A and 28B (see FIG. 3). According to the second embodiment, the height levels of the proximal end arms 26A and 28A are different, as shown in FIG. 7. Therefore, the distal end portion of one driven link 94A is rotatably supported on the lower surface side of the proximal end arm 26A. The distal end portion of the other driven link 94B is rotatably supported on the upper surface side of the proximal end arm 28A, in the same manner as in the first embodiment. Hence, the two picks 26C and 28C can advance and retreat in one direction although their heights are different. In the second embodiment, in order to set the height levels of the two picks 26C and 28C to be equal during operation, a Z-axis moving mechanism (not shown) which moves the entire apparatus in the vertical direction (Z direction) is disposed.

Figure 8A:
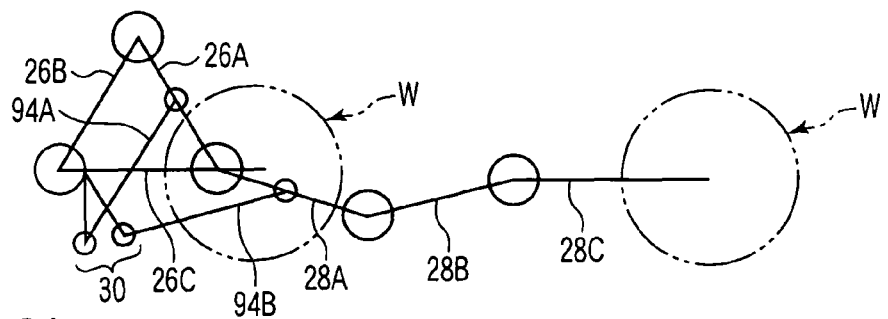
FIGS. 8A to 8D are views schematically showing a series of operating states of the transfer apparatus shown in FIG. 5.
Figure 8B:
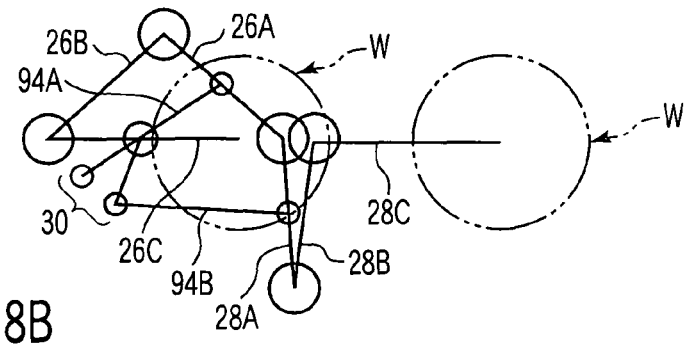

FIGS. 8A to 8D are views schematically showing a series of operating states of the transfer apparatus shown in FIG. 5. FIG. 8A shows a state wherein the second arm mechanism 28 is extended and the first arm mechanism 26 is contracted. In this state, when the link mechanism 30 is pivoted in the opposite direction, the second arm mechanism 28 starts to contract as shown in FIG. 8B, and the first arm mechanism 26 starts to extend. At this time, the pick 26C of the first arm mechanism 26 slightly retreats temporarily.

Figure 8C:
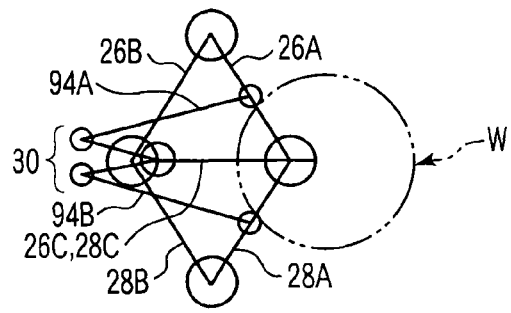
Figure 8D:
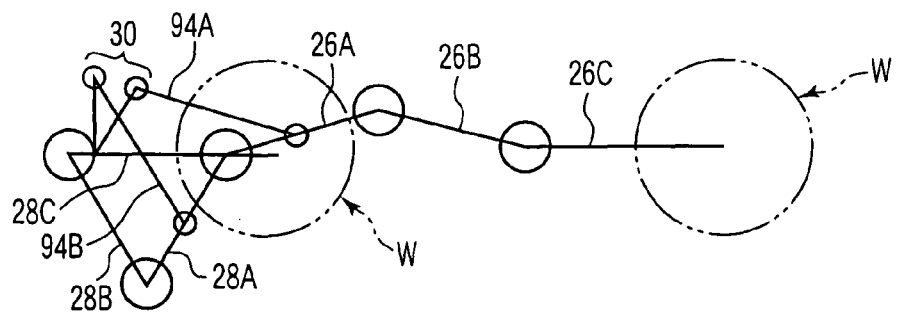

When the link mechanism 30 is further pivoted in the opposite direction, the second arm mechanism 28 further continues contracting while the first arm mechanism 26 continues extending, as shown in FIG. 8C. At this time point, the two picks 26C and 28C overlap vertically. When the link mechanism 30 is further pivoted in the opposite direction, the second arm mechanism 28 contracts the most while the first arm mechanism 26 extends the most, as shown in FIG. 8D.

The two picks 26C and 28C are exchanged in this manner. In the actual operation, the entire apparatus is slightly moved upward or downward at the time point shown in FIG. 8C to adjust the height levels of the two picks 26C and 28C.

In this manner, according to the second embodiment, the two, first and second arm mechanisms 26 and 28 respectively having the vertically overlapping two picks 26C and 28C can be bent or stretched by only two motors, i.e., the first and second driving sources 32 and 34. Therefore, the structure of the apparatus can be simplified and the cost can be decreased.

Third Embodiment

Figure 9:
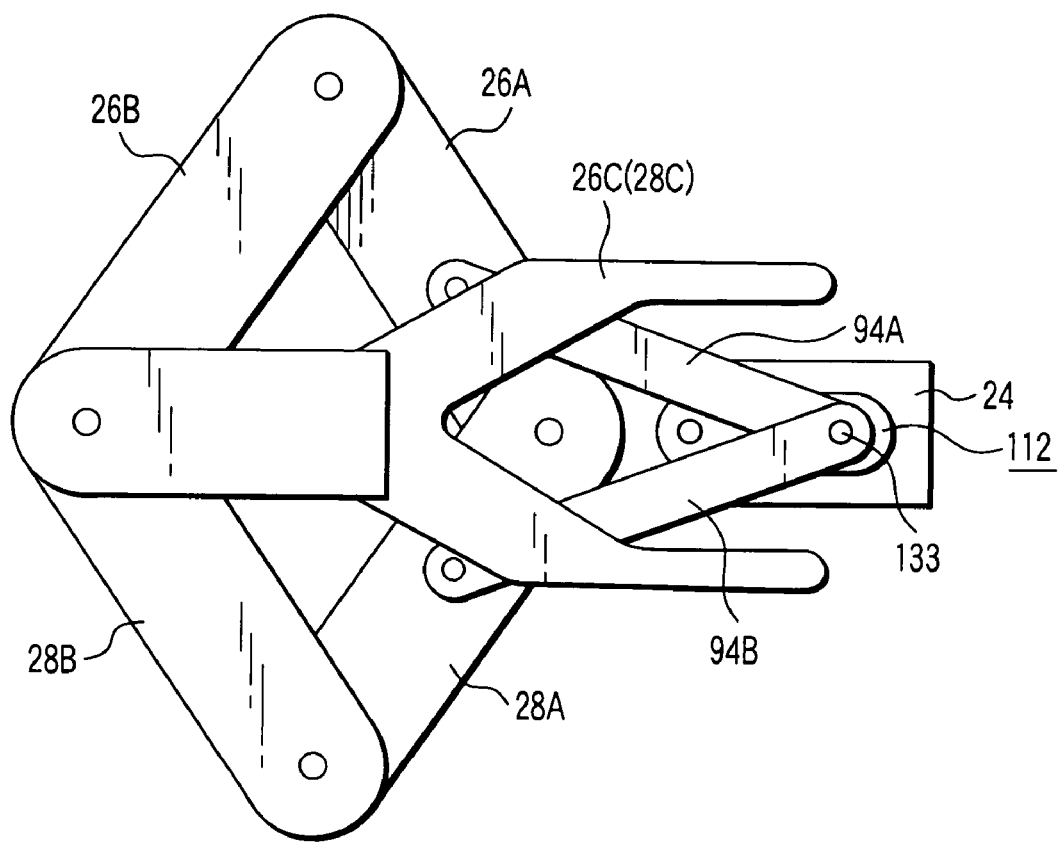
FIG. 9 is a plan view showing a state of a transfer apparatus according to a third embodiment of the present invention wherein two arm mechanisms are contracted.
Figure 10:
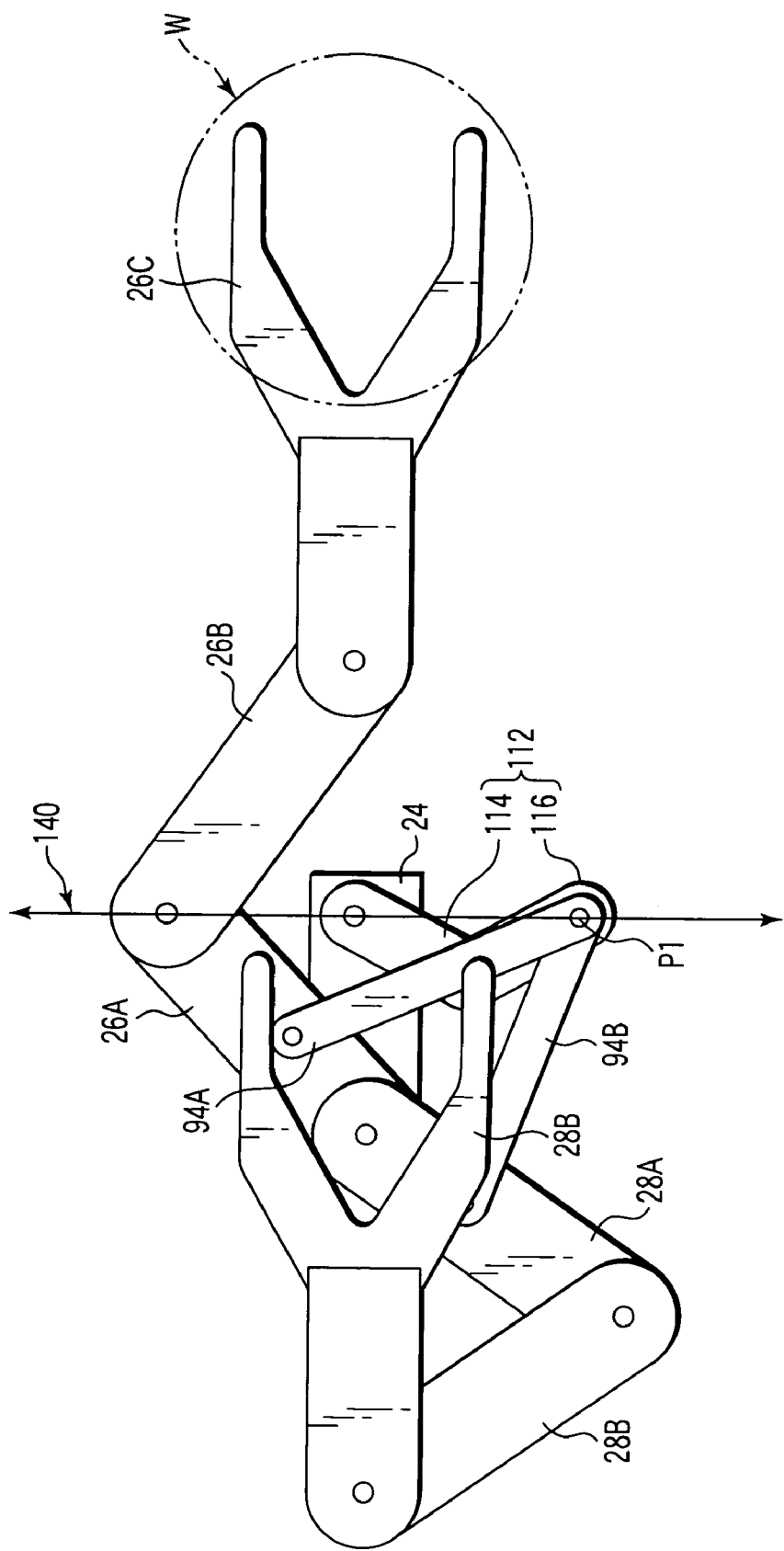
FIG. 10 is a plan view showing a state of the transfer apparatus shown in FIG. 9 wherein one arm mechanism is extended.
Figure 11:
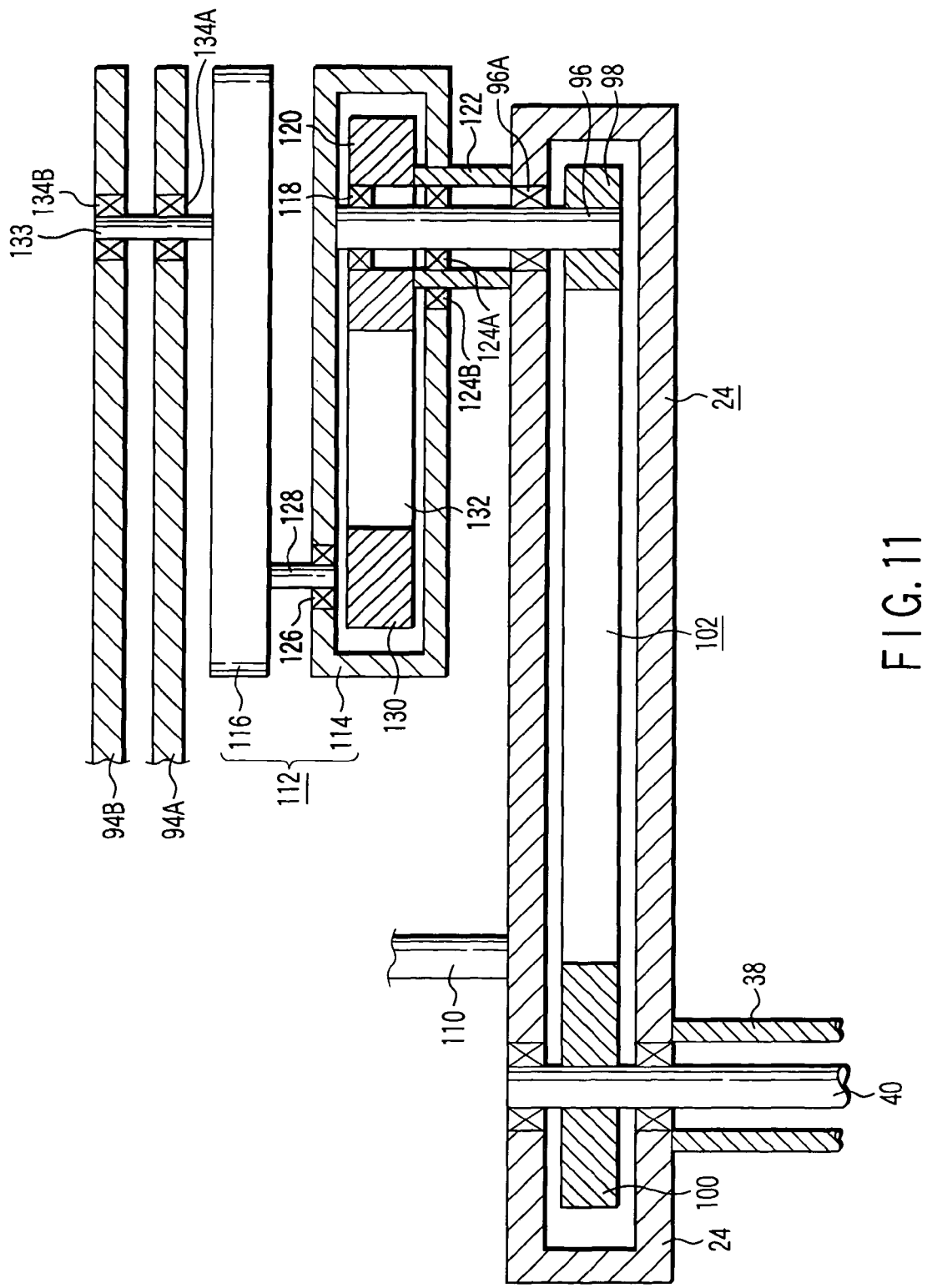
FIG. 11 is a partially cutaway view mainly showing the link mechanism portion of the transfer apparatus shown in FIG. 9.

FIG. 9 is a plan view showing a state of a transfer apparatus according to a third embodiment of the present invention wherein two arm mechanisms are contracted. FIG. 10 is a plan view showing a state of the transfer apparatus shown in FIG. 9 wherein one arm mechanism is extended. FIG. 11 is a partially cutaway view mainly showing the link mechanism portion of the transfer apparatus shown in FIG. 9.

According to the third embodiment, in the same manner as in the second embodiment, picks 26C and 28C overlap vertically, and the proximal end portions of first and second arm mechanisms 26 and 28 are coaxial and pivotal. The third embodiment is largely different from the first and second embodiments in the following respect. Namely, the driving link 92 (see FIGS. 1 and 6) of the link mechanism 30 is replaced by a small link mechanism 112, i.e., which is small. In other words, as apparent from comparison with FIG. 4, in place of the driving link 92 shown in FIG. 4, the small link mechanism 112 is disposed as shown in FIG. 11.

The small link mechanism 112 comprises a first link lever 114 and a second link lever 116. The two levers 114 and 116 are coupled to each other, so that they can bend and stretch. More specifically, the first link lever 114 is hollow. The upper end portion of a rotary shaft 96 at the distal end portion of a rotary base 24 is disposed to extend through the proximal end portion of the first link lever 114. The upper end of the rotary shaft 96 is fixed inside the upper surface of the first link lever 114. Hence, the first link lever 114 and rotary shaft 96 rotate integrally.

A large pulley 120 is rotatably disposed in the rotary shaft 96 in the first link lever 114 through a bearing 118. A hollow outer shaft 122 is disposed around the rotary shaft 96 to be coaxial with it. The lower end of the outer shaft 122 is fixed to the upper surface of the rotary base 24. The upper end of the outer shaft 122 is fixed to the large pulley 120.

A bearing 124A is interposed between the rotary shaft 96 and outer shaft 122. A bearing 124B is interposed between the outer shaft 122 and the extending portion of the first link lever 114. The two shafts 96 and 122 are thus rotatable. A rotary shaft 128 is rotatably disposed at the distal end portion of the first link lever 114 through a bearing 126. A small pulley 130 is fixed on the rotary shaft 128. A coupling belt 132 is looped between the small pulley 130 and large pulley 120 to transmit driving power. The ratio in diameter of the small pulley 130 to the large pulley 120 is set to 1:2. The upper end portion of the rotary shaft 128 projects upward. The proximal end portion of the second link lever 116 is fixed to the projecting upper end portion of the rotary shaft 128. Thus, the rotary shaft 128 and second link lever 116 rotate integrally.

A fixed shaft 133 is disposed at the distal end portion of the second link lever 116 to extend upright. The proximal end portion of one driven link 94A is rotatably attached to the lower portion of the fixed shaft 133 through a bearing 134A. The driven link 94A bends or stretches the first arm mechanism 26. The proximal end portion of the other driven link 94B is rotatably attached to the upper portion of the fixed shaft 133 through a bearing 134B. The driven link 94B bends or stretches the second arm mechanism 28. In the example shown in FIG. 11, the distal end portions of the two driven links 94A and 94B are rotatably supported on the upper surface sides of proximal end arms 26A and 28A, respectively. Alternatively, the distal end portions of the two driven links 94A and 94B may be rotatably supported on the lower surface sides of the proximal end arms 26A and 26B, or on the upper and lower surface sides of the proximal end arms 26A and 26B.

According to the third embodiment, when the second driving source 34 (see FIG. 3) is rotatably driven clockwise and counterclockwise, the small link mechanism 112 bends or stretches. At this time, a fulcrum P1 at the proximal end portions of the two driven links 94A and 94B of a link mechanism 30 reciprocates on a straight line 140 in FIG. 10. Hence, the first and second arm mechanisms 26 and 28 extend and contract alternately.

In this manner, according to the third embodiment, the two, first and second arm mechanisms 26 and 28 respectively having the vertically overlapping two picks 26C and 28C can be bent or stretched by only two motors, i.e., the first and second driving sources 32 and 34. Therefore, the structure of the apparatus can be simplified and the cost can be decreased.

Fourth Embodiment

Figure 12:
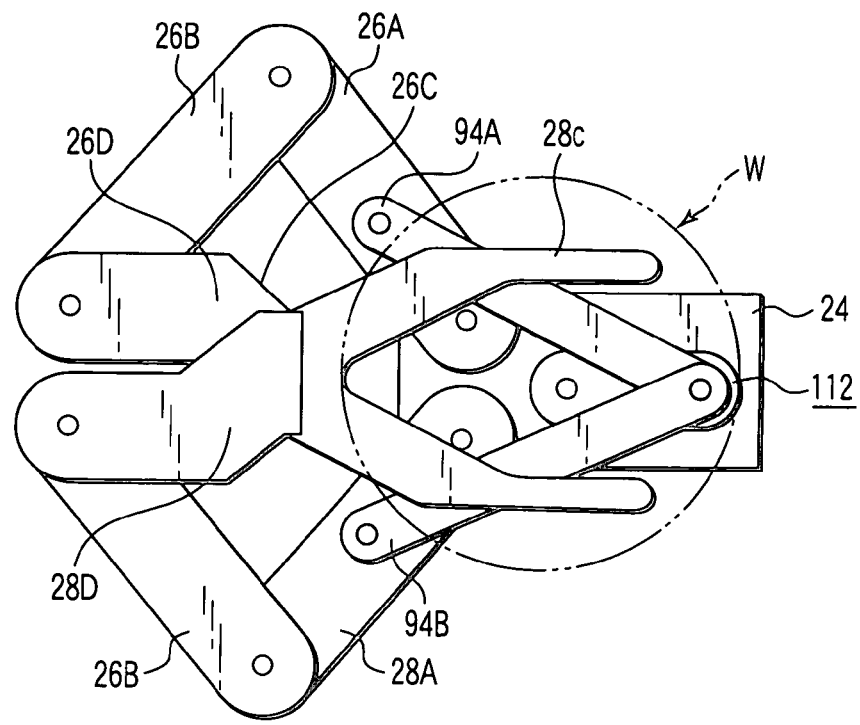
FIG. 12 is a plan view showing a state of a transfer apparatus according to a fourth embodiment of the present invention wherein two arm mechanisms are contracted.
Figure 13:
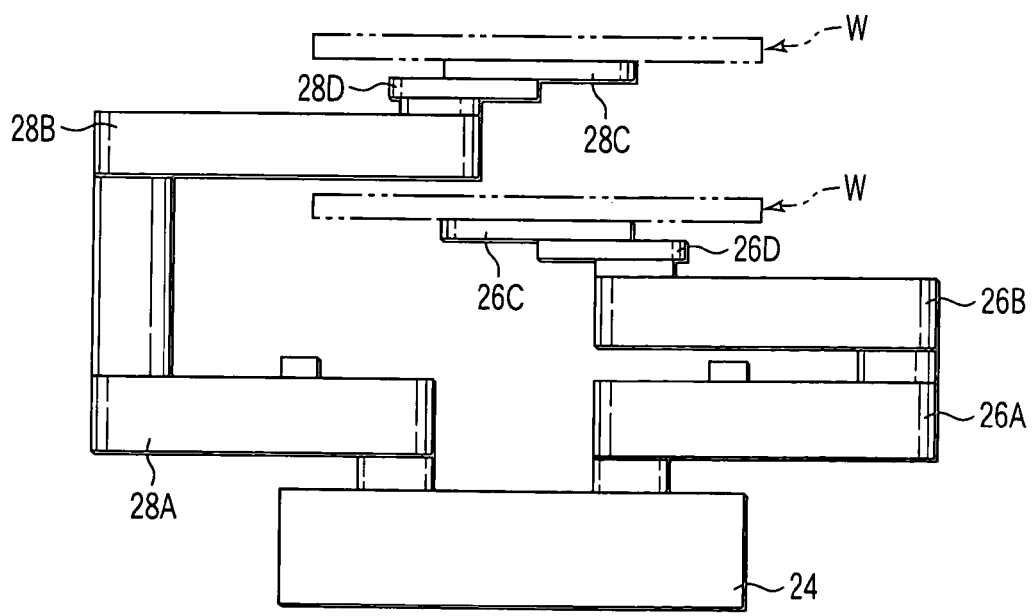
FIG. 13 is a side view showing the transfer apparatus shown in FIG. 12.
Figure 14:
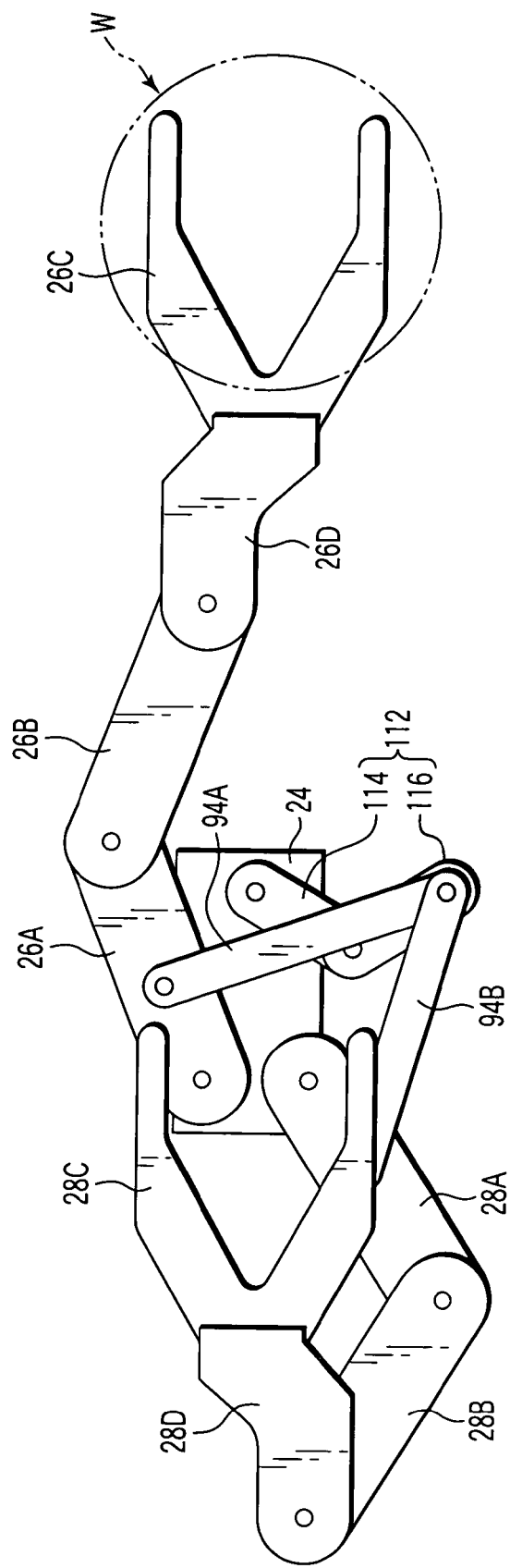
FIG. 14 is a plan view showing a state of the transfer apparatus shown in FIG. 12 wherein one arm mechanism is extended.

FIG. 12 is a plan view showing a state of a transfer apparatus according to a fourth embodiment of the present invention wherein two arm mechanisms are contracted. FIG. 13 is a side view showing the transfer apparatus shown in FIG. 12. FIG. 14 is a plan view showing a state of the transfer apparatus shown in FIG. 12 wherein one arm mechanism is extended.

According to the fourth embodiment, picks 26C and 28C overlap vertically, and a small link mechanism 112 is disposed in a link mechanism 30, in the same manner as in the third embodiment. The fourth embodiment is different from the third embodiment in the following respect. That is, first and second arm mechanisms 26 and 28 are supported on a rotary base 24 not by one fixed shaft, but respectively, rotatably by two fixed shafts 50 and 52, in the same manner as in the first embodiment.

The first arm mechanism 26 comprises a proximal end arm 26A, an intermediate arm 26B, a pick 26C, and a proximal end portion 26D of the pick 26C. The second arm mechanism 28 comprises a proximal end arm 28A, an intermediate arm 28B, a pick 28C, and a proximal end portion 28D of the pick 28C. The second arm mechanism 28 is arranged above the first arm mechanism 26, so the two vertically overlapping picks 26C and 28C will not interfere with each other.

The fourth embodiment can exhibit the same function and effect as those of the third embodiment. Namely, the two, first and second arm mechanisms 26 and 28 respectively having the vertically overlapping two picks 26C and 28C can be bent or stretched by only two motors, i.e., first and second driving sources 32 and 34. Therefore, the structure of the apparatus can be simplified and the cost can be decreased.

Fifth Embodiment

Figure 15:
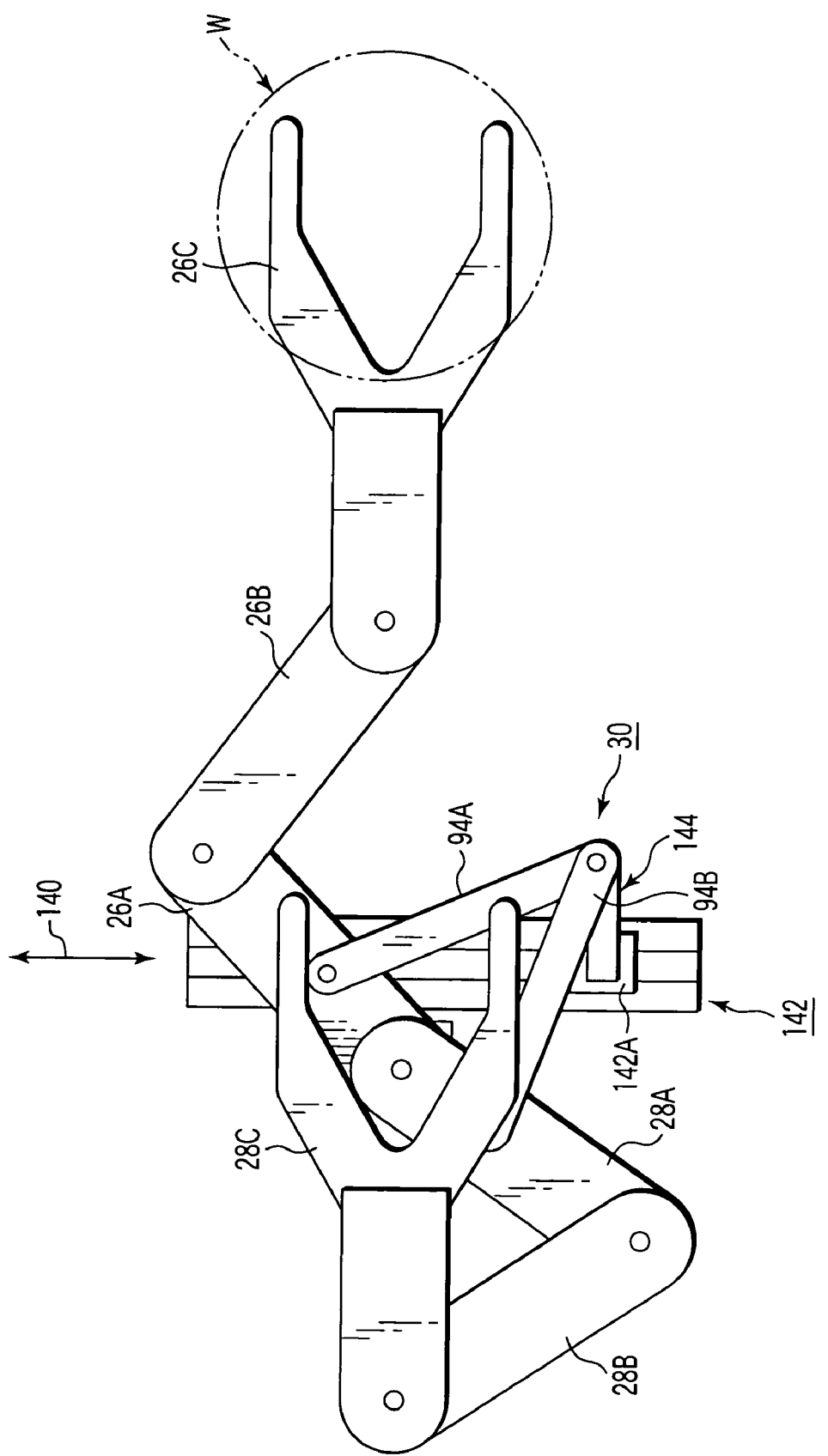
FIG. 15 is a plan view showing a state of a transfer apparatus according to a fifth embodiment of the present invention wherein one arm mechanism is extended.
Figure 16:
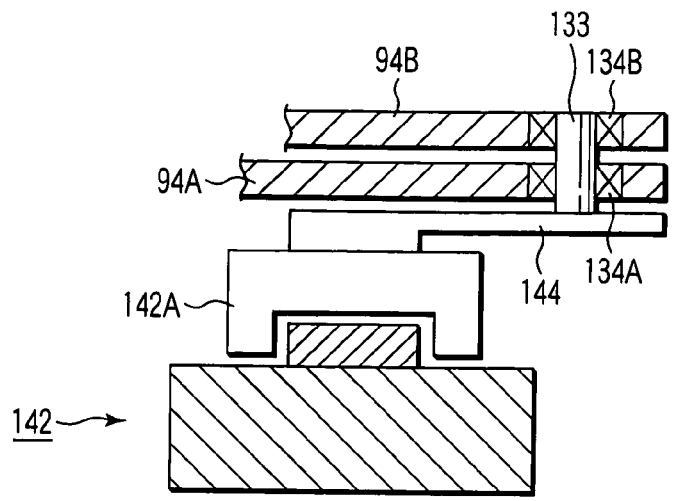
FIG. 16 is a partially cutaway view of the transfer apparatus shown in FIG. 15 to explain the coupled state of a linear motor, used as the second driving source, with a link mechanism.

FIG. 15 is a plan view showing a state of a transfer apparatus according to a fifth embodiment of the present invention wherein one arm mechanism is extended. FIG. 16 is a partially cutaway view of the transfer apparatus shown in FIG. 15 to explain the coupled state of a linear motor, used as a second driving source, with a link mechanism.

The fifth embodiment has substantially the same arrangement as that of the third embodiment but is different from it mainly in the following respects. More specifically, in the third embodiment, the small link mechanism 112 is coupled to the proximal end portions of the two driven links 94A and 94B of the link mechanism 30, as shown in FIG. 10. When the small link mechanism 112 is bent or stretched, the proximal end portions of the driven links 94A and 94B reciprocate along the straight line 140. In contrast to this, in the fifth embodiment, a linear motor 142 is disposed, as shown in FIGS. 15 and 16. The linear motor 142 is capable of accurate position control along a straight line 140. The linear motor 142 serves as the second driving source 34 shown in FIG. 3.

A support rod 144 is attached and fixed to a moving body 142A of the linear motor 142. A fixed shaft 133 is disposed on the support rod 144 to extend upright. The proximal end portions of driven links 94A and 94B are rotatably attached and fixed to the fixed shaft 133 respectively through bearings 134A and 134B, in the same manner as that described with reference to FIG. 11.

In the fifth embodiment, the linear motor 142 is used as the second driving source. More specifically, the proximal end portion sides of the two driven links 94A and 94B of a link mechanism 30 are rotatably supported on the moving body 142A side of the linear motor 142 directly, so as to linearly move the moving body 142A. In this case, the second driving source 34 in the motor box 44, and the driving pulley 100, driven pulley 98, and coupling belt 102 in the rotary base 24, which are described with reference to FIGS. 3 and 4, become unnecessary. Hence, the arrangement of the apparatus can be more simplified accordingly.

In the fifth embodiment, the proximal end portions of the two driven links 94A and 94B are reciprocated along the straight line 140 by reciprocating the moving body 142A of the linear motor 142. Then, first and second arm mechanisms 26 and 28 can be bent or stretched in the same manner as in the third embodiment (see FIG. 10). In this manner, according to the fifth embodiment, the two, first and second arm mechanisms 26 and 28 respectively having vertically overlapping two picks 26C and 28C can be bent or stretched by only two motors, i.e., a first driving source 32 and the linear motor 142 serving as the second driving source. Therefore, the structure of the apparatus can be simplified and the cost can be decreased.

Sixth Embodiment

Figure 17:
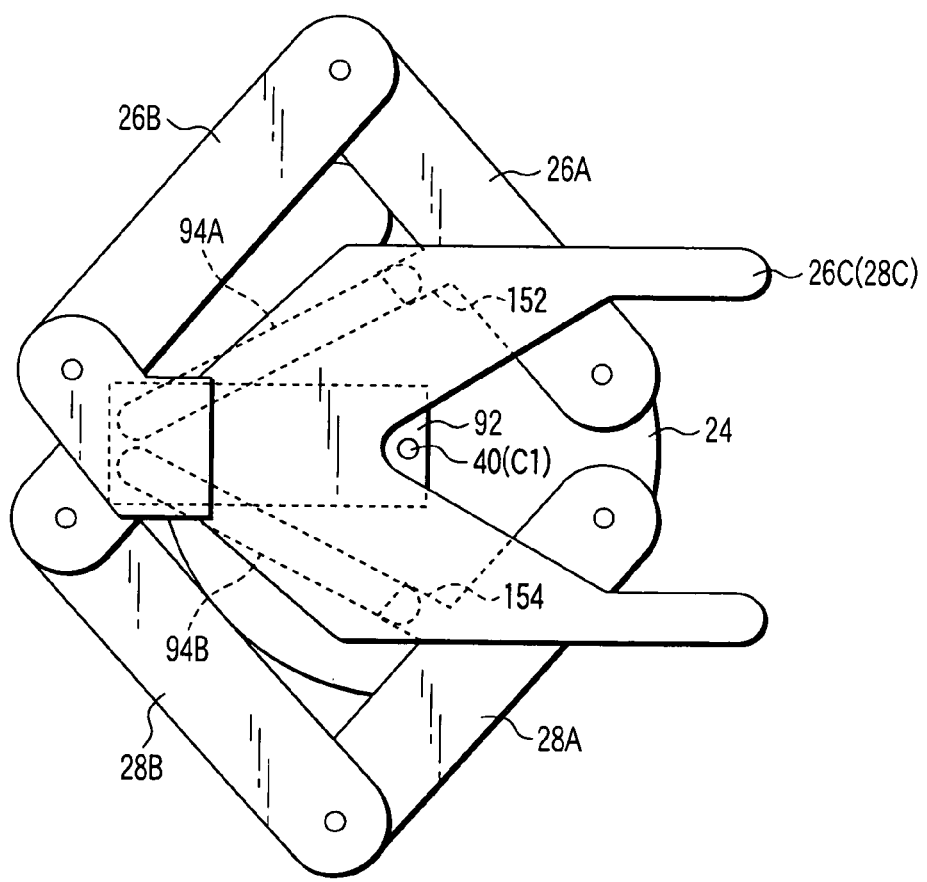
FIG. 17 is a plan view showing a state of a transfer apparatus according to a sixth embodiment of the present invention wherein two arm mechanisms are contracted.
Figure 19:
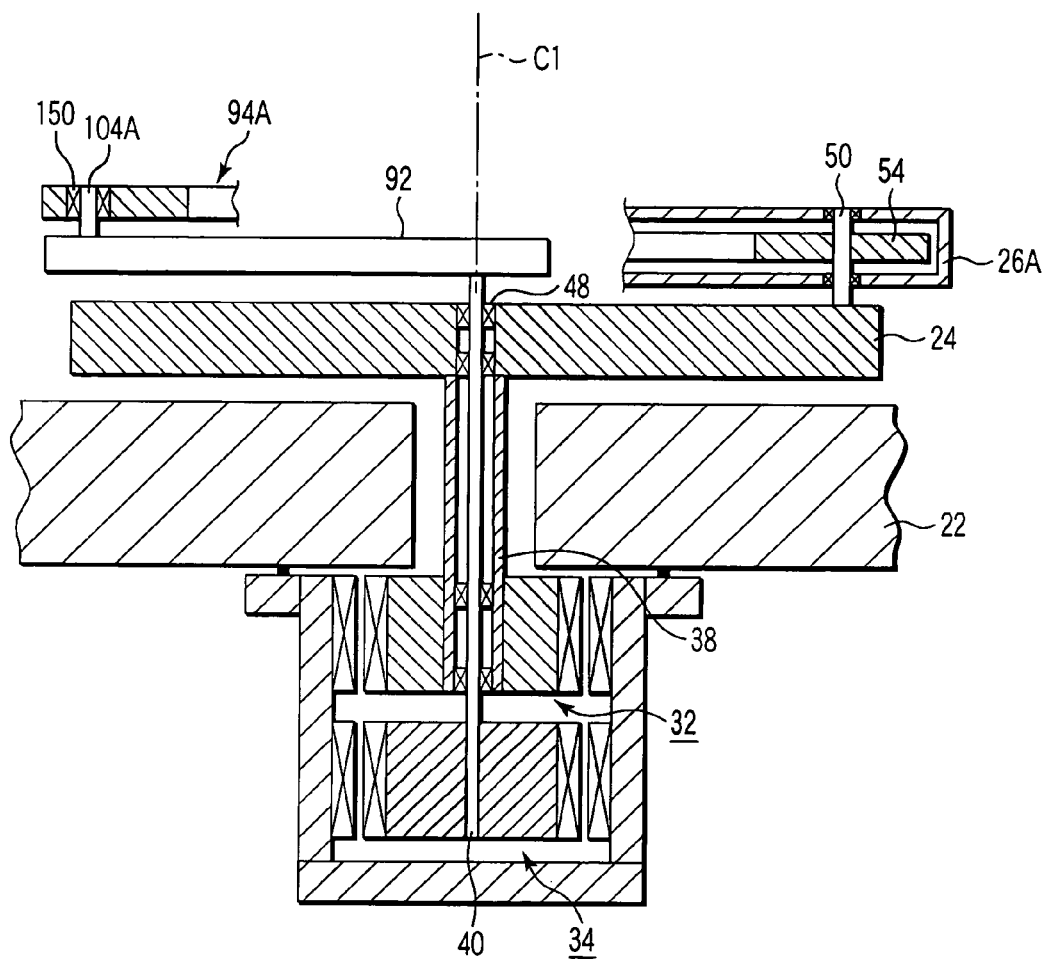
FIG. 19 is a partially cutaway view showing the transfer apparatus shown in FIG. 17.

FIG. 17 is a plan view showing a state of a transfer apparatus according to a sixth embodiment of the present invention wherein two arm mechanisms are contracted. FIG. 18 is a plan view showing a state of the transfer apparatus shown in FIG. 17 wherein one arm mechanism is extended. FIG. 19 is a partially cutaway view showing the transfer apparatus shown in FIG. 17.

The sixth embodiment has an arrangement similar to that of the fourth embodiment but is different from the fourth embodiment mainly in the following respects. More specifically, according to the fourth embodiment, the driving power of the second driving source 34 is transmitted to two driven links 94A and 94B through a driving pulley 100 of the rotary base 24, a coupling belt 102, a driven pulley 98, and the small link mechanism 112. In contrast to this, according to the sixth embodiment, the proximal end portions of two driven links 94A and 94B are coupled to a driving shaft 40 of a second driving source 34 through the driving link 92 of the first embodiment shown in FIG. 1.

In other words, the proximal end portion of the driving link 92 is directly coupled and fixed to the driving shaft 40 of the second driving source 34. Thus, the driving link 92 is rotatably supported at the rotation center portion of a rotary base 24. In the same manner as in the first embodiment shown in FIG. 1, support pins 104A and 104B (see FIG. 18) are disposed at the distal end portion of the driving link 92 to extend upright. The proximal end portions of the two driven links 94A and 94B are rotatably supported respectively by the support pins 104A and 104B through bearings 150. FIG. 19 shows only one driven link 94A.

In the sixth embodiment, the proximal end portions of first and second arm mechanisms 26 and 28 are rotatably supported on the rotary base 24 by different shafts to be parallel to each other in the same manner as in the fourth embodiment. Two picks 26C and 28C are arranged to vertically overlap, and bent or stretched in the same direction. Horizontally extending coupling projections 152 and 154 are disposed at substantially the central portions of respective proximal end arms 26A and 28A. The distal end portions of the driven links 94A and 94B are respectively, pivotally supported by the auxiliary projections 152 and 154 through bearings (not shown).

In the sixth embodiment, the apparatus operates substantially in the same manner as in the fourth embodiment. Note that in the sixth embodiment, the driving link 92 pivots about the driving shaft 40 of the second driving source 34 as the center. Thus, the proximal end portions of the two driven links 94A and 94B respectively reciprocate along arcuate loci about the driving shaft 40 as the center, unlike in the fourth embodiment. The first and second arm mechanisms 26 and 28 are accordingly bent or stretched in opposite directions.

FIGS. 20A to 20G are views schematically showing a series of operating states of the transfer apparatus shown in FIG. 17. FIG. 20A shows a state wherein the first arm mechanism 26 is extended while the second arm mechanism 28 is contracted. In this state, when the driving link 92 is rotated to pivot a link mechanism 30 in an opposite direction, the first arm mechanism 26 starts to contract accordingly, as shown in FIG. 20B, while the second arm mechanism 28 hardly moves.

Assume that the driving link 92 is further rotated to pivot the link mechanism 30 in the opposite direction. The first arm mechanism 26 continues contraction while the second arm mechanism 28 starts to extend slightly, as shown in FIG. 20C. When the driving link 92 further rotates, the two picks 26C and 28C vertically overlap at this time point, as shown in FIG. 20D. In this case, both the first and second arm mechanisms 26 and 28 are contracted considerably.

Assume that the driving link 92 is further rotated to pivot the link mechanism 30 in the opposite direction. The first arm mechanism 26 keeps the contracted state while the second arm mechanism 28 gradually extends to reach the most extended state, as shown in FIGS. 20E to 20G. The two picks 26C and 28C are exchanged in this manner. In the actual operation, at the time point shown in FIG. 20D, the entire apparatus is slightly moved upward or downward to adjust the height levels of the two picks 26C and 28C.

In this manner, according to the sixth embodiment, the two, first and second arm mechanisms 26 and 28 respectively having the vertically overlapping two picks 26C and 28C can be bent or stretched by only two motors, i.e., a first driving source 32 and the second driving source 34. Therefore, the structure of the apparatus can be simplified and the cost can be decreased. As the driving link 92 is coupled to the driving shaft 40 of the second driving source 34, a power transmission mechanism comprising a pulley, a coupling belt, and the like becomes unnecessary, and the arrangement of the apparatus can accordingly be more simplified.

Seventh Embodiment

Figure 21:
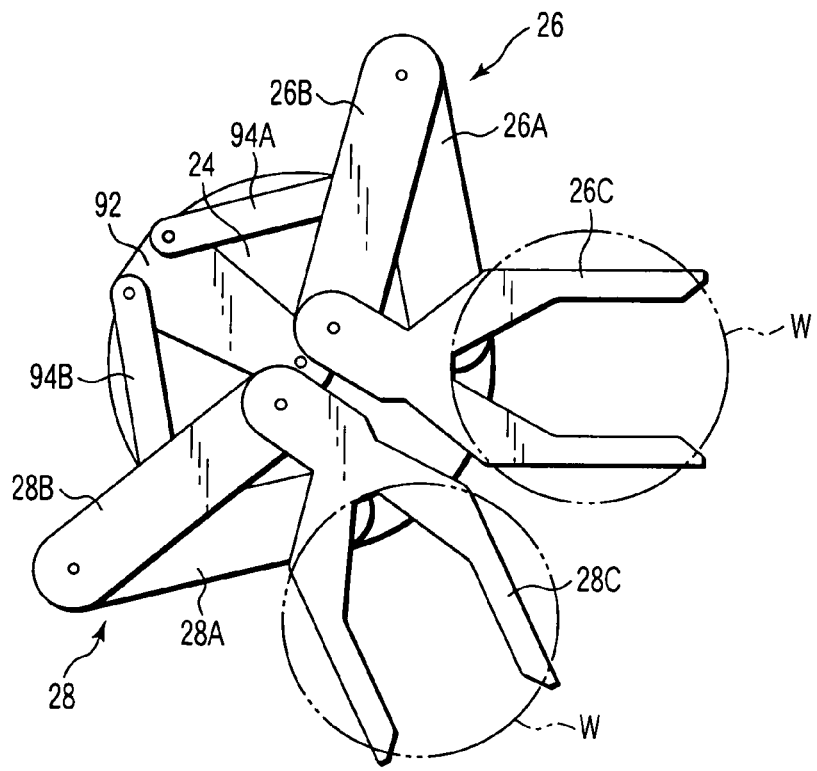
FIG. 21 is a plan view showing a state of a transfer apparatus according to a seventh embodiment of the present invention wherein two arm mechanisms are contracted.

FIG. 21 is a plan view showing a state of a transfer apparatus according to a seventh embodiment of the present invention wherein two arm mechanisms are contracted. The connection state in the vertical direction of the first and second driving sources, rotary base, and first and second arm mechanisms of this apparatus is similar to that shown in FIG. 3. The connection state in the vertical direction of the first and second driving sources, rotary base, and one arm mechanism of this apparatus is similar to that shown in FIG. 19.

The seventh embodiment is similar to the first embodiment. Proximal end arms 26A and 28A of first and second arm mechanisms 26 and 28 are supported on a rotary base 24 (circular in FIG. 21) to be rotatable about shafts, which are spaced apart from each other on one plane, as centers. Picks 26C and 28C of the first and second arm mechanisms 26 and 28 are arranged on one plane to face in different directions. The open angle of the picks 26C and 28C is set within a range of 60° to 180°. In the seventh embodiment, however, the pivot shaft of a driving link 92 of a link mechanism 30 is arranged to be coaxial with the rotary shaft of the rotary base 24, unlike in the first embodiment.

The operations of the first and second arm mechanisms 26 and 28 of the seventh embodiment are those of the first and sixth embodiments combined together. More specifically, in the initial state shown in FIG. 21, both the first and second arm mechanisms 26 and 28 are contracted. In this state, assume that the second arm mechanism 28 extends to advance the pick 28C. In this case, the first arm mechanism 26 substantially maintains its contracted state. However, as the rotary base 24 rotates, the angle formed by the proximal end arm 26A and an intermediate arm 26B enlarges to retreat the pick 26C. These operations are similar to those shown in FIGS. 20D to 20G. In this case, however, the pick 26C does not keep facing forward, but faces to an oblique direction, as shown in FIG. 2.

According to the seventh embodiment, an advantage can be obtained that when compared to the first embodiment, the entire structure becomes more compact. According to the seventh embodiment, an advantage can be obtained that when compared to the sixth embodiment, the entire apparatus need not be lifted when switching between the first and second arm mechanisms 26 and 28.

Eighth Embodiment

Figure 22:
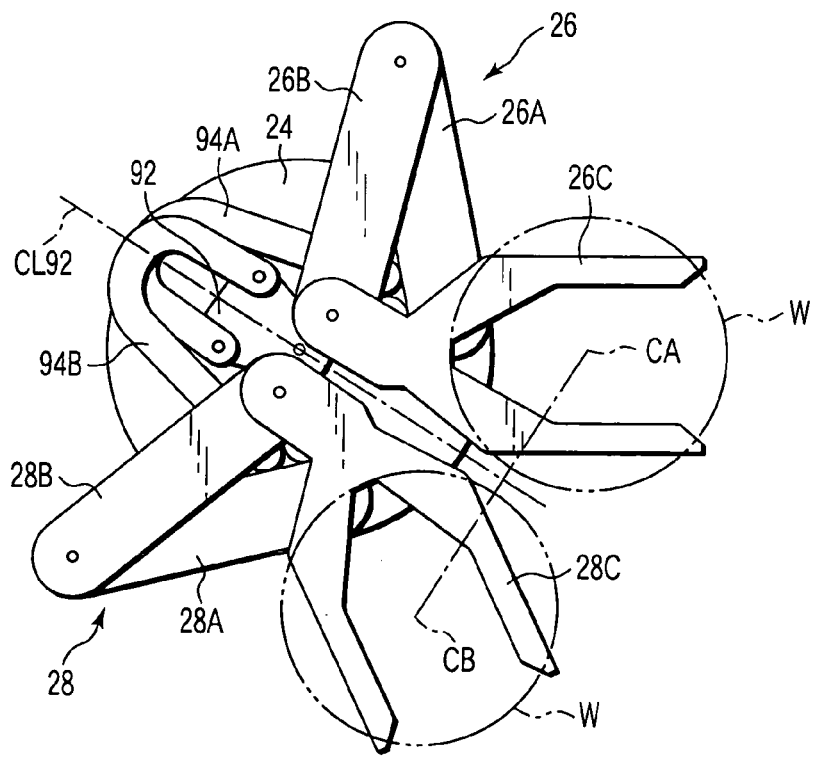
FIG. 22 is a plan view showing a state of a transfer apparatus according to an eighth embodiment of the present invention wherein two arm mechanisms are contracted.

FIG. 22 is a plan view showing a state of a transfer apparatus according to an eighth embodiment of the present invention wherein two arm mechanisms are contracted. FIG. 23 is a perspective view showing a state of the transfer apparatus shown in FIG. 22 wherein one arm mechanism is extended. The connection state in the vertical direction of the first and second driving sources, rotary base, and first and second arm mechanisms of this apparatus is similar to that shown in FIG. 3. The connection state in the vertical direction of the first and second driving sources, rotary base, and one arm mechanism of this apparatus is similar to that shown in FIG. 19.

The eighth embodiment is similar to the seventh embodiment. Proximal end arms 26A and 28A of first and second arm mechanisms 26 and 28 are supported on a circular rotary base 24 to be rotatable about shafts, which are spaced apart from each other on one plane, as centers. Picks 26C and 28C of the first and second arm mechanisms 26 and 28 are arranged on one plane to face in different directions. The open angle of the picks 26C and 28C is set within a range of 60° to 180°. The pivot shaft of a driving link 92 of a link mechanism 30 is arranged to be coaxial with the rotary shaft of the rotary base 24.

Different from the seventh embodiment, in the eighth embodiment, two driven links 94A and 94B form a U shape, are arranged at different height levels, and are disposed to intersect each other. More specifically, as shown in FIG. 22, the driven link 94A coupled to the first arm mechanism 26 is axially supported by the driving link 92 on a side close to the second arm mechanism 28 across a center line CL92. Similarly, the driven link 94B coupled to the second arm mechanism 28 is axially supported by the driving link 92 on a side close to the first arm mechanism 26 across the center line CL92. The center line CL92 is a perpendicular bisector of a line segment CA-CB in an initial state where both the first and second arm mechanisms 26 and 28 are contracted. The line segment CA-CB connects centers CA and CB of the picks 26C and 28C of the first and second arm mechanisms 26 and 28, respectively.

Figure 24A:
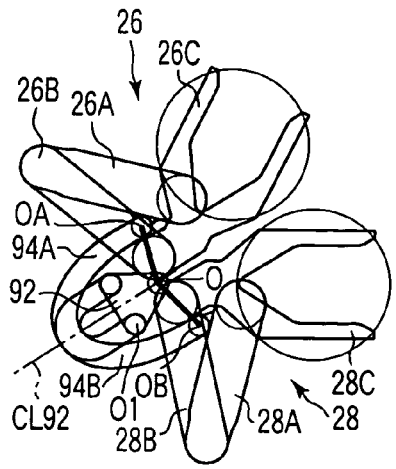
FIGS. 24A to 24E are views schematically showing a series of operating states of the transfer apparatus shown in FIG. 12.

FIGS. 24A to 24E are views schematically showing a series of operating states of the transfer apparatus shown in FIG. 12. FIG. 24A shows the initial state where both the first and second arm mechanisms 26 and 28 are contracted. In this initial state, when the rotary base 24 is rotated counterclockwise, the second arm mechanism 28 extends to move the pick 28C forward, while the first arm mechanism 26 substantially maintains its contracted state (see FIGS. 24B to 24E). As the driven links 94A and 94B are arranged in the same manner as described above, the moving acceleration generated in the pick 26C of the first arm mechanism 26 decreases.

The reason for this will be described by way of line segments O-OA and O-OB. The line segment O-OA connects a pivot shaft O of the driving link 92 and a coupling point OA of the proximal end arm 26A and second driven link 94A. The line segment O-OB connects the pivot shaft O and a coupling point OB of the proximal end arm 28A and second driven link 94B. The transfer apparatus according to the eighth embodiment is formed in the following manner. Namely, the change amount of the line segment O-OA or O-OB including the coupling point OA or OB of that one of the first and second arm mechanisms 26 and 28 which is not extended (contraction side) should decrease. For example, in the operation example shown in FIGS. 24A to 24E, assume that in the contracted state shown in FIG. 24A, the rotary base 24 is rotated. Then, the second arm mechanism 28 extends, and accordingly the length of the line segment O-OB on the second arm mechanism 28 side increases. In contrast to this, the length of the line segment O-OA on the first arm mechanism 26 side does not change much until the extended state of the second arm mechanism 28 shown in FIG. 24E.

Figure 24B:
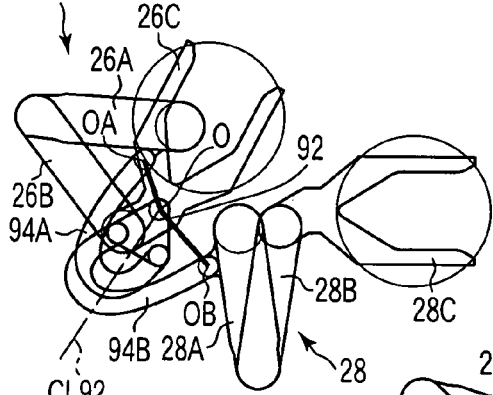
Figure 24C:
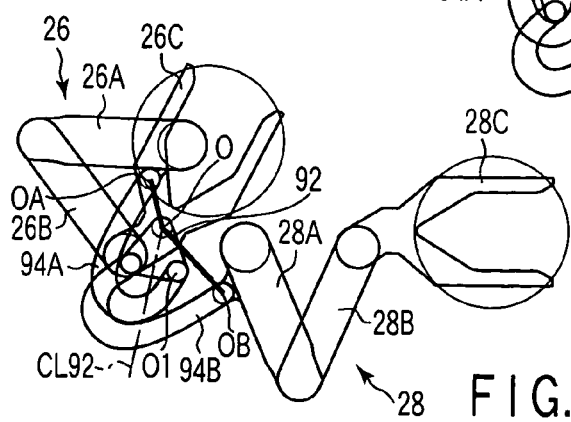
Figure 24D:
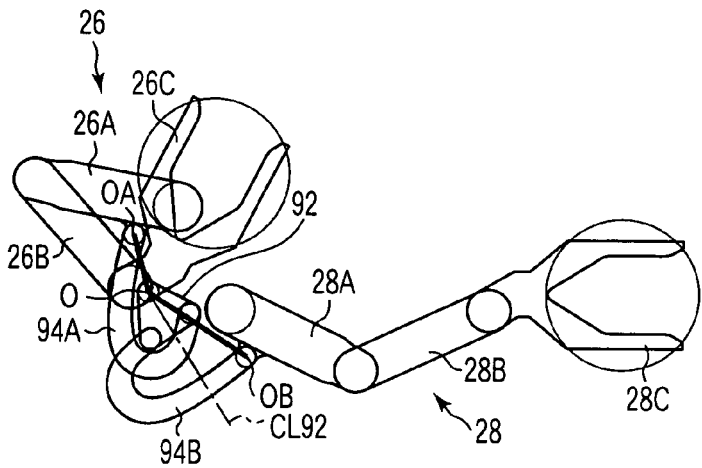
Figure 24E:
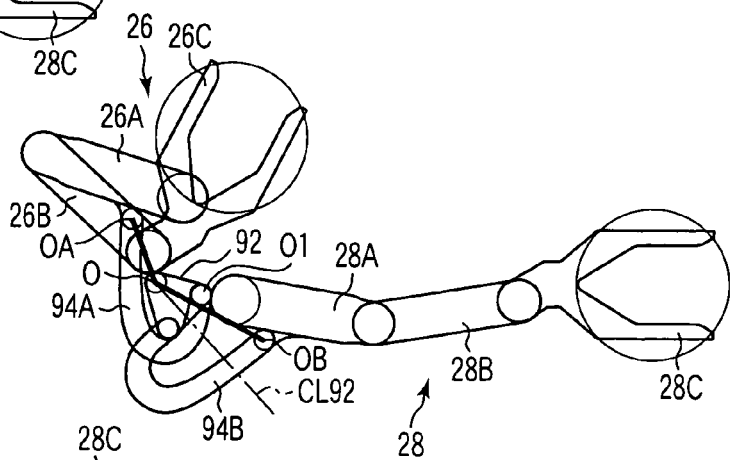

As the result of this arrangement, on the first arm mechanism 26 side as the contracted side, as the rotary base 24 rotates, the following operation takes place. Namely, first, as shown in FIGS. 24A to 24C, the angle formed by the proximal end arm 26A and an intermediate arm 26B increases gradually to slightly displace the pick 26C backward. Then, as shown in FIGS. 24C to 24E, the angle formed by the proximal end arm 26A and intermediate arm 26B gradually decreases to slightly displace the pick 26C so as to be restored forward. Note that FIG. 24C shows a dead point state where three points, i.e., the pivot shaft O of the driving link 92, the coupling point OA of the proximal end arm 26A and second driven link 94A, and a coupling point O1 of the driving link 92 and driven link 94A, line up on one straight line.

In this manner, according to the eighth embodiment, from the initial state where both the first and second arm mechanisms 26 and 28 contract, the second arm mechanism 28 extends. During this period of time, the first arm mechanism 26 changes between states via the dead point state (the state shown in FIG. 24C where the three points O, OA, and O1 line up on one straight line). Therefore, the pick 26C of the contracted-side first arm mechanism 26 moves slowly by retreating slightly at first and then advancing slightly. The stroke of the pick 26C is also small. Assume that from the initial state where both the first and second arm mechanisms 26 and 28 contract, the first arm mechanism 26 extends. In this case as well, the pick 28C of the second arm mechanism 28 operates similarly.

In order to confirm the above effect, the apparatuses according to the seventh and eighth embodiments were fabricated with the same specification except for the link mechanism. The two apparatuses were subjected to a comparative experiment. In this experiment, from the initial state where both the first and second arm mechanisms 26 and 28 contracted, the first arm mechanism 26 was extended. The arm strokes of the first and second arm mechanisms 26 and 28 at this time were measured.

Figure 25:
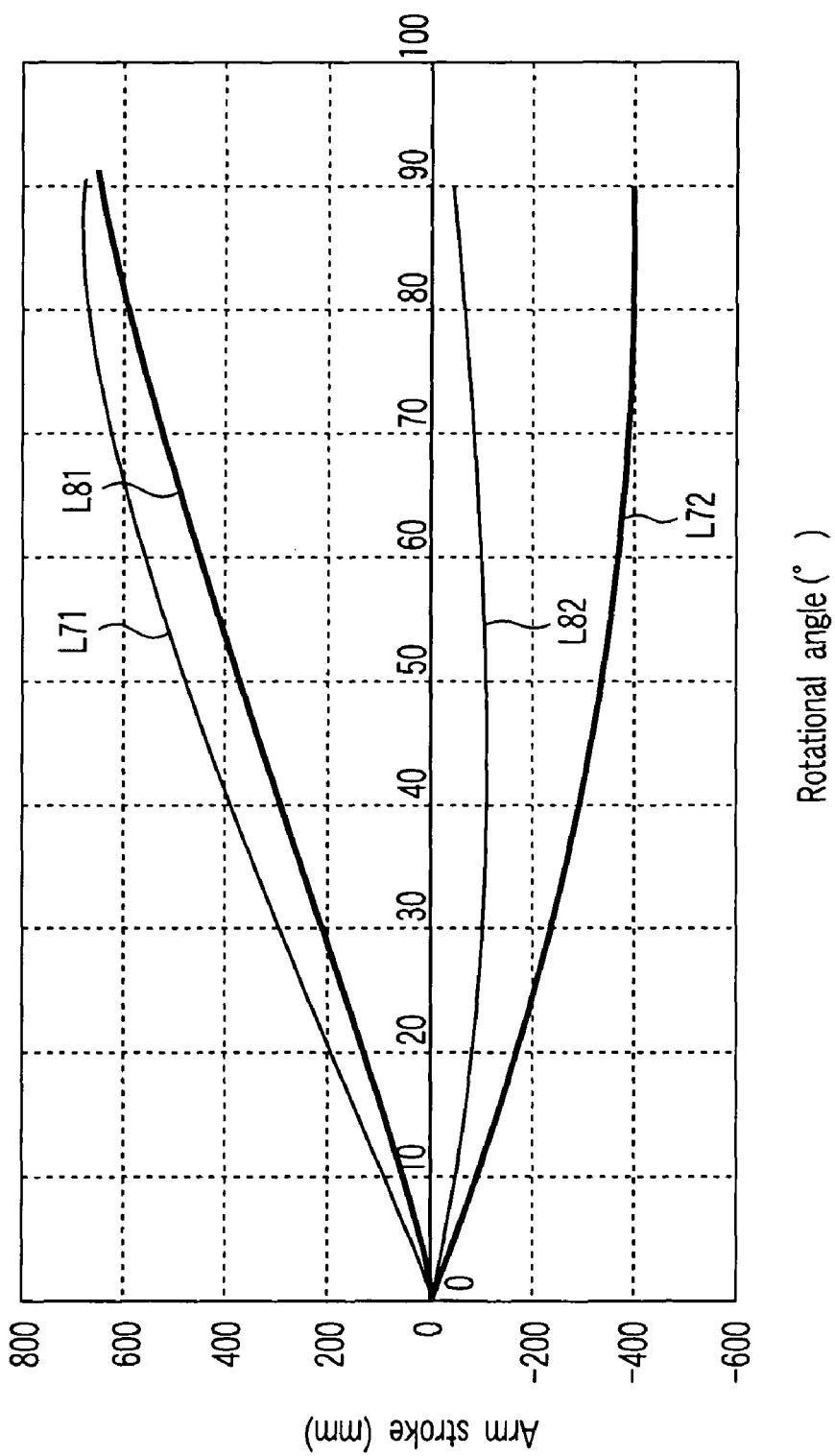
FIG. 25 is a graph showing the results of a comparative experiment of apparatuses according to the seventh and eighth embodiments which are formed with the same specifications except for a link mechanism.

FIG. 25 is a graph showing the results of this comparative experiment. In FIG. 25, reference numerals L71 and L81 respectively denote the arm strokes of the first arm mechanisms 26 of the apparatuses according to the seventh and eighth embodiments. Reference numerals L72 and L82 respectively denote the arm strokes of the second arm mechanisms 28 of the apparatuses according to the seventh and eighth embodiments. In FIG. 25, the axis of abscissa represents the rotation angle (°) of the rotary base 24, and the axis of ordinate represents the arm stroke (mm).

Assume that the arm stroke necessary for the first arm mechanism 26 is 600 mm. In this case, as shown in FIG. 25, in the apparatuses according to the seventh and eighth embodiments, the rotary bases 24 must be rotated through about 70° and 80°, respectively. During this rotation, the arm stroke of the second arm mechanism 28 of the apparatus according to the seventh embodiment increases progressively until a maximal value of about 400 mm. Meanwhile, the arm stroke of the second arm mechanism 28 of the apparatus according to the eighth embodiment takes a maximal value of about 100 mm when the rotary base 24 rotates through about 40°, and then decreases again.

In this manner, according to the eighth embodiment, while one arm mechanism extends, the pick of the other arm mechanism moves slowly. Also, the maximal value of the arm stroke of the pick of the other arm mechanism is small. Therefore, the moving acceleration generated in this pick decreases, and a wafer W on the pick does not positionally shift readily. As a result, the operation speed of the apparatus can be increased, thus increasing the throughput.

<Common Matters Among First to Eighth Embodiments>

As the bearing for each of the first and second arm mechanisms 26 and 28, one obtained by subjecting the surface of an aluminum alloy housing to a rigid sulfuric-acid anodized aluminum process can be employed. If the housing is formed of an aluminum alloy, the arm mechanism can be suppressed from falling down by its own weight. In addition, the inertia generated when the arm mechanism is actuated can be decreased to improve the transfer accuracy of the arm mechanism. Depending on the process, a magnetic field may be formed in the process chamber. If an aluminum alloy housing is employed, the arm mechanism can be prevented from being swung by the magnetic field. Furthermore, with a housing having a surface subjected to an anodized aluminum process, the anodized aluminum film is sufficiently impregnated with grease, so that the replenish service life of the grease can be prolonged.

The first to eighth embodiments are exemplified by a case wherein the transfer apparatus is set in a vacuum atmosphere. Alternatively, the transfer apparatus may be set in an atmosphere under atmospheric pressure. The first to eighth embodiments are exemplified by a case wherein the semiconductor wafers are exchanged by loading and unloading them in and from the process chamber by the transfer apparatus. Alternatively, the transfer apparatus may be disposed midway along a wafer transfer path to which no process chamber is concerned directly.

<Driving Mechanism>

In the above embodiments, a transfer apparatus which transfers a target substrate is described. The driving mechanism used in this transfer apparatus will now be described in detail.

In a generally used conventional driving mechanism, regarding a coaxial two-shaft structure, encoders (absolute type or increment type) and the like are arranged in the driving sources of the respective driving shafts in order to recognize the rotational speeds, rotational angles, and like of the respective driving shafts. A relative positional relationship between the respective driving shafts can be obtained by calculating output signals from the encoders. As the encoders are provided in this manner, the entire structure of the driving mechanism becomes complicated to increase the cost. Spaces to set the encoders and the like are necessary, which leads to a bulky apparatus. Furthermore, wiring cords must be connected to the driving shafts to send the signals from the encoders and the like. Therefore, the driving shafts themselves cannot but have finite-rotary structures.

In the driving mechanism according to the present invention, an optical sensor is used to simplify the entire structure and allow easy recognition of the positional relationship in the rotational direction of the respective driving shafts relative to each other. When the positional relationship between the respective driving shafts relative to each other is obtained, the original point can be determined and the states of the first and second arm mechanisms can be checked. For example, various states can be checked, e.g., a state wherein the two arm mechanisms are folded and contracted, a state wherein either one arm mechanism is extended to the maximum, and a state wherein even if the gate valve of the process chamber is closed, it will not interfere with the arm mechanism, thus causing no problem.

Figure 27:
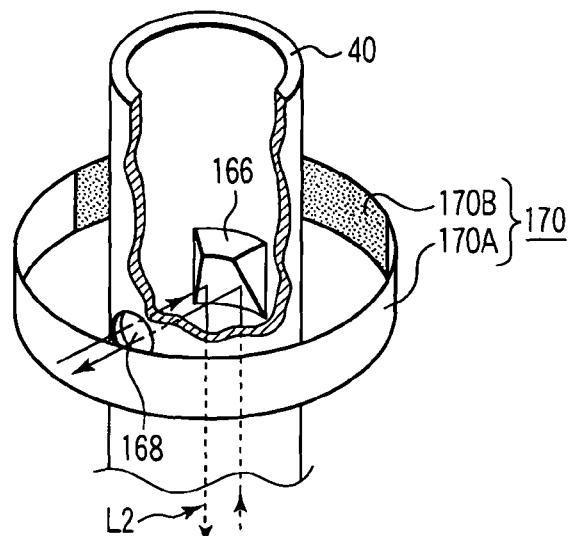
FIG. 27 is a view for explaining the positional relationship between a detection pattern and a reflection member, which is a main part of the driving mechanism shown in FIG. 26.
Figure 28:
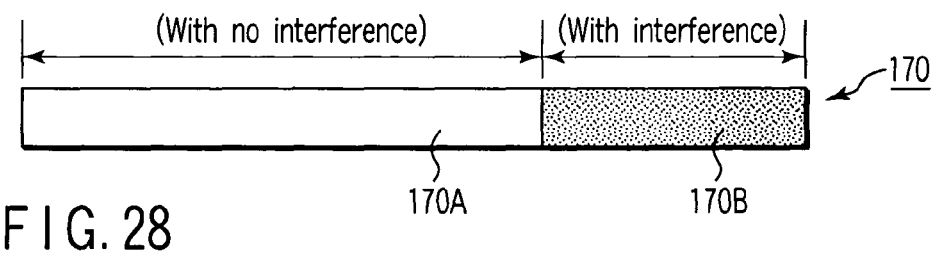
FIG. 28 is a plan view showing a state wherein the detection pattern shown in FIG. 27 is linearly developed.

FIG. 26 is an enlarged sectional view showing a driving mechanism according to an embodiment of the present invention. FIG. 27 is a view for explaining the positional relationship between a detection pattern and a reflection member, which is a main part of the driving mechanism shown in FIG. 26. FIG. 28 is a plan view showing a state wherein the detection pattern shown in FIG. 27 is linearly developed.

The driving mechanism to be described hereinafter can be used in all of the transfer apparatuses according to the first to eighth embodiments described above. A case will be described hereinafter wherein the driving mechanism is applied to the first embodiment shown in FIGS. 1 to 4.

As shown in FIG. 26, a driving mechanism 160 incorporates a plurality of coaxial and rotatable hollow pipe-like driving shafts, i.e., the two driving shafts 38 and 40 in the example shown in FIG. 26. The first and second driving sources 32 and 34 are respectively connected to the outer and inner driving shafts 38 and 40. Connection of the driving shafts 38 and 40 includes not only a case wherein they are mechanically directly connected but also a case wherein they are connected in a noncontact manner as in magnetic connection.

A light-emitting portion 162 emits detection light L1 in the inner driving shaft 40 along the axial direction. The detection light L1 is reflected by a reflection member 166 in a predetermined direction. The reflected detection light L1 passes through a light-transmitting window 168 outward. A detection pattern 170 to be irradiated with the detection light L1 is disposed on the inner surface of the outer driving shaft 38. Reflected light L2 from the detection pattern 170 is received by a light-receiving portion 164 along a route opposite to that of the detection light L1. For example, a position detector 172 comprising a microcomputer or the like detects the positional relationship between the driving shafts 38 and 40 in the rotational direction on the basis of an output from the light-receiving portion 164.

More specifically, the two hollow pipe-like driving shafts 38 and 40 are rotatably supported by a bearing 46 interposed between them. The inner driving shaft 40 is coupled to the second driving source 34 and is rotated clockwise and counterclockwise by the source. The outer driving shaft 38 is coupled to the first driving source 32 and rotated clockwise and counterclockwise by the source.

The light-emitting portion 162 and light-receiving portion 164 are fixed side by side on the bottom portion side of the motor box 44. The motor box 44 is a housing that accommodates the first and second driving sources 32 and 34. As the light-emitting portion 162 and light-receiving portion 164, an integral reflection type optical sensor can be used. The light-receiving portion 164 emits the detection light L1 along the axial direction of the hollow pipe-like inner driving shaft 40. As the detection light L1, a laser beam which travels highly straightly is preferable, but diffused light may also be used instead. The wavelength of the detection light L1 can be set in all bands including the infrared band, visible light band, and ultraviolet band.

The reflection member 166 is formed of, e.g., a reflection mirror, and attached and fixed to the inner surface side of the inner driving shaft 40 inclinedly such that its reflection surface is at an angle of, e.g., 45°. The reflection member 166 reflects the detection light L1 at a right angle in the radial direction of the inner driving shaft 40. The light-transmitting window 168 comprising, e.g., a circular opening, is formed at that portion of the side wall of the inner driving shaft 40 on which the detection light L1 reflected by the reflection member 166 is incident. The light-transmitting window 168 suffices as far as it can transmit the detection light L1. When the inner driving shaft 40 is formed of a transparent material such as a transparent plastic resin or silica glass, the detection light L1 is transmitted through the side wall of the driving shaft 40. Therefore, no opening need be formed in the driving shaft 40, but the entire side wall serves as a light-transmitting window.

At that portion of the inner surface of the outer driving shaft 38 on which the detection light L1 passing through the light-transmitting window 168 is incident, the detection pattern 170 is disposed in the circumferential direction. As shown in FIG. 28, the detection pattern 170 has a light-reflecting area 170A which reflects the detection light L1 and a light-absorbing area 170B which absorbs the detection light L1. The two areas 170A and 170B have predetermined lengths.

As described in the first embodiment, when the inner driving shaft 40 is rotated clockwise and counterclockwise through a predetermined rotational angle, the first and second arm mechanisms 26 and 28 (see FIGS. 1 to 3) bend or stretch selectively. For example, the length of the light-reflecting area 170A is set to fall within a range (zone) where the first and second arm mechanisms 26 and 28 will not interfere with (collide against) a gate valve (not shown) even if the gate valve is closed. This gate valve partitions the transfer chamber and the process chamber arranged around the transfer chamber from each other, and is selectively opened and closed. The length of the light-absorbing area 170B is set to fall within a range (zone) where the gate valve interferes with the first or second arm mechanism 26 or 28.

Therefore, the position detector 172 can recognize the positions in the rotational direction of the two driving shafts 38 and 40 relative to each other on the basis of an output from the light-receiving portion 164 which receives the reflected light L2 from the detection pattern 170. The position detector 172 then can determine whether the gate valve can be closed. This determination result is transmitted to a host computer or the like which controls the overall operation of the semiconductor processing system.

The operation of the driving mechanism 160 having the above arrangement will be described.

First, as described in the first embodiment, with the outer driving shaft 38 (rotary base 24: see FIG. 1) being stationary, the inner driving shaft 40 is rotated clockwise and counterclockwise through a predetermined angle. This bends or stretches the first and second arm mechanisms 26 and 28 selectively to load and unload, e.g., a wafer, into and from the process chamber. When the directions of the first and second arm mechanisms 26 and 28 are to be changed, the two driving shafts 38 and 40 are rotated through a predetermined angle in synchronism with each other. At this time, the first and second arm mechanisms 26 and 28 are entirely rotated in a desired direction while they are being maintained in the same bent or stretched posture.

In the transfer apparatus which perform this basic operation, in what postures the first and second arm mechanisms 26 and 28 take must always be grasped. This is particularly necessary when the gate valve which partitions the transfer chamber and process chamber from each other is to be closed or when the arm mechanisms 26 and 28 are to be rotated entirely.

The light-emitting portion 162 emits the detection light L1 in order to recognize the positional relationship in the rotational direction between the two driving shafts 38 and 40. The detection light L1 travels inside the inner driving shaft 40 in the axial direction and is reflected by the reflection member 166 to change its traveling direction by almost 90°. The detection light L1, the traveling direction of which is changed, passes through the light-transmitting window 168 to irradiate the detection pattern 170 which is disposed on the inner surface of the outer driving shaft 38 along the circumferential direction. When the detection light L1 irradiates the light-reflecting area 170A of the detection pattern 170, it is reflected to form the reflected light L2. The reflected light L2 travels along the optical path described above in the opposite direction and is received by the light-receiving portion 164. When the detection light L1 irradiates the light-absorbing area 170B, it is absorbed and does not form the reflected light L2.

The position detector 172 which receives an output from the light-receiving portion 164 recognizes the positional relationship in the rotational direction between the two driving shafts 38 and 40 on the basis of the output. In the driving mechanism 160, the light-emitting portion 162 and light-receiving portion 164 serve as a zone identification sensor. For example, if the light-receiving portion 164 does not receive the reflected light L2, the reflection surface of the reflection member 166 is directed to part of the zone of the light-absorbing area 170B in FIG. 28. This signifies that either one of the two arm mechanisms 26 and 28 is extended more than the predetermined length. In this case, if the gate valve is closed, interference (collision) may occur. Thus, it is prohibited to close the gate valve or to rotate the arm mechanisms 26 and 28 entirely.

In contrast to this, if the light-receiving portion 164 receives the reflected light L2, the reflection surface of the reflection member 166 is directed to part of the zone of the light-reflecting area 170A in FIG. 28. This signifies that both the arm mechanisms 26 and 28 bend or stretch not more than a predetermined length. In this case, interference (collision) will not occur. Hence, it is allowed to close the gate valve or to rotate the arm mechanisms 26 and 28 entirely.

In this manner, the positional relationship between the two driving shafts 38 and 40 relative to each other, i.e., the bent or stretched state of the two arm mechanisms 26 and 28, can be recognized. In this case, an expensive, large-size encoder or the like which is required in the conventional driving mechanism need not be used. As a result, the structure is simplified to not only largely decrease the cost, but also contribute to downsizing and space reduction.

Generally, the first and second driving sources 32 and 34 comprise stepping motors or servo motors. In this case, the determination result of the position detector 172 can be used as a determination standard for the interlock function. For example, assume that the host computer is to perform a process of closing the gate valve in accordance with a software process. In this case, if the position detector 172 detects a signal "reflected light L2 not received", the arm mechanism interferes with the gate valves. Hence, interlocking can be performed with an electrical circuit configuration so as not to close the gate valve on the basis of the determination result of the position detector 72.

Figure 29:
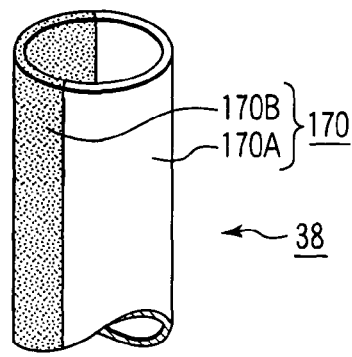
FIG. 29 is a perspective view showing a case wherein an entire outer driving shaft is formed as a detection pattern.

In the driving mechanism 160 shown in FIG. 26, the detection pattern 170 is formed on the inner surface of the outer driving shaft 38. Alternatively, that portion of the outer driving shaft 38 which opposes at least the light-transmitting window 168 may be entirely formed as the detection pattern 170. FIG. 29 is a perspective view showing a case wherein the entire outer driving shaft 38 is formed as the detection pattern 170. Referring to FIG. 29, the light-reflecting area 170A is set such that at least its inner wall surface is surface-polished to reflect light. In contrast to this, the light-absorbing area 170B is set such that at least its inner wall surface is subjected to a black anodized aluminum process (when the driving shaft 38 is made of aluminum) to absorb light.

Figure 30:
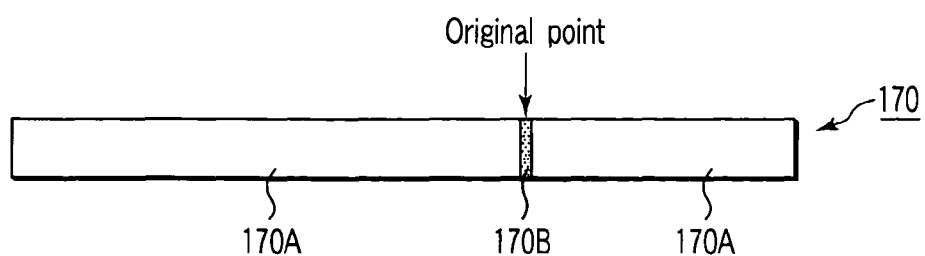
FIG. 30 is a developed view showing a detection pattern of a case wherein a detection structure is used as a position sensor.

In the driving mechanism 160 shown in FIG. 26, a detection structure including the light-emitting portion 162, light-receiving portion 164, and the like is used as a zone sensor which detects a region having a constant width. Alternatively, this detection structure may be used as a position sensor which detects a constant position. In this case, the constant position can be defined as the original point. FIG. 30 is a developed view showing the detection pattern 170 of a case wherein the detection structure is used as a position sensor. As shown in FIG. 30, the light-absorbing area 170B is linearly formed at a predetermined portion of the detection pattern 170 to have a small width that the light-receiving portion 164 can barely recognize. This position serves as the original point. Accordingly, the remaining region forms the light-reflecting area 170A. The relationship between the light-absorbing area 170B and light-reflecting area 170A may be reversed.

When the detection structure is used as the position sensor in this manner, the original point of the positions of the two driving shafts 38 and 40 relative to each other, i.e., the original point of the two arm mechanisms 26 and 28, can be obtained. As such an original point, a state can be set wherein the two arm mechanisms 26 and 28 both bend or stretch equally to be contracted, as shown in FIG. 1.

Figure 31:
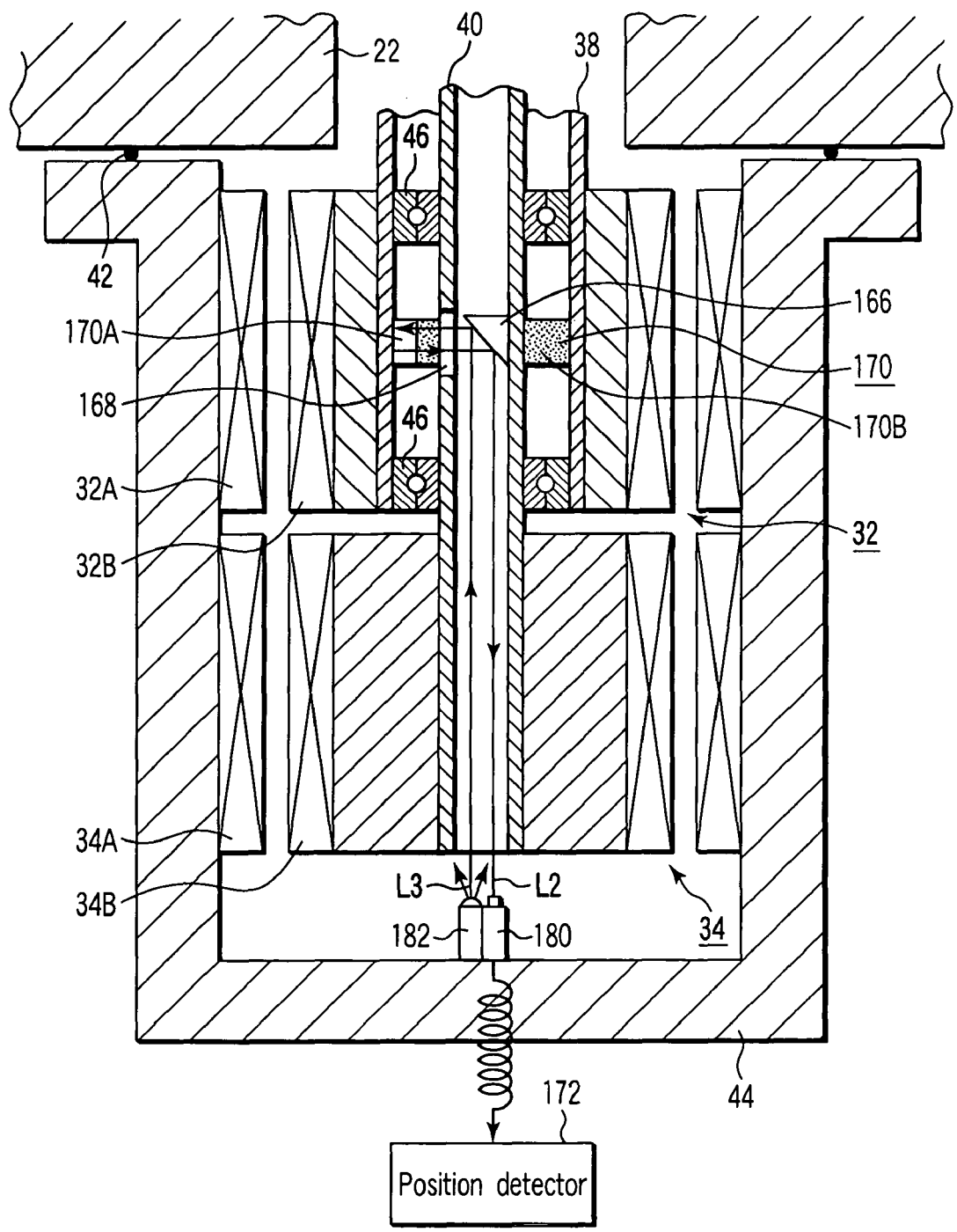
FIG. 31 is an enlarged sectional view showing a modification of the driving mechanism shown in FIG. 26.

In the driving mechanism 160 shown in FIG. 26, the light-receiving portion 164 is disposed to detect the presence/absence of the reflected light L2. Alternatively, an image sensor may be provided to receive the image of the detection pattern 170. FIG. 31 is an enlarged sectional view showing a modification of the driving mechanism shown in FIG. 26 based on this point of view. FIGS. 32A to 32D are plan views respectively showing states wherein examples of the detection pattern used in the driving mechanism shown in FIG. 31 are linearly developed.

As shown in FIG. 31, in place of the light-receiving portion 164 (see FIG. 26), an image sensor 180 comprising, e.g., a CCD camera, is arranged to recognize the image of the detection pattern 170. When the detection pattern 170 portion is dark, an illumination member to illuminate this portion is desirably disposed. Thus, in FIG. 31, in place of the light-emitting portion 162 (see FIG. 26), an illumination member 182 is disposed which can brighten a region having a certain area. For example, the illumination member is an LED (light-emitting diode). Illumination light L3 from the illumination member 182 illuminates part of the detection pattern 170. When the detection pattern 170 is bright with external light, the illumination member 182 is not necessary.

When the image sensor 180 is provided in this manner, the position detector 172 can recognize different lightnesses, different colors, different figures, and the like. If the detection pattern 170 has a structure as shown in FIG. 28 or 30, the light-reflecting area 170A and light-absorbing area 170B can be recognized in accordance with a difference in lightness. Also, the detection pattern 170 can be formed as shown in FIGS. 32A to 32D.

Figure 32A:
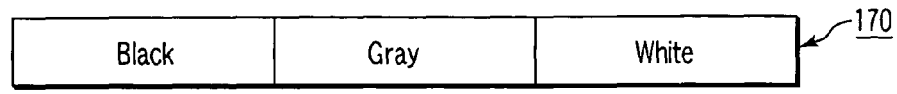
FIGS. 32A to 32D are plan views respectively showing states wherein examples of a detection pattern used in the driving mechanism shown in FIG. 31 are linearly developed.
Figure 32B:
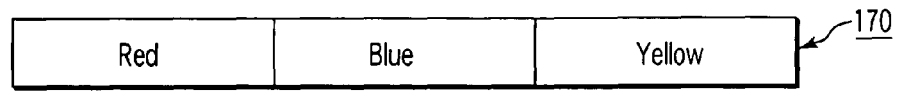

In FIG. 32A, the detection pattern 170 is divided into three regions, e.g., "black", "gray", and "white" regions. The three regions are recognized in accordance with a difference in lightness. These regions may be formed "gray" with different lightnesses. In FIG. 32B, the detection pattern 170 is divided into three regions, e.g., red", "blue", and "yellow". The three regions are identified in accordance with a difference in color.

Figure 32C:
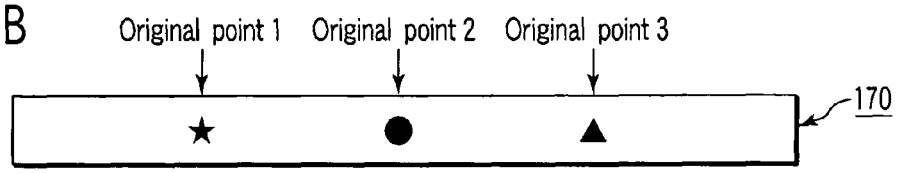
Figure 32D:
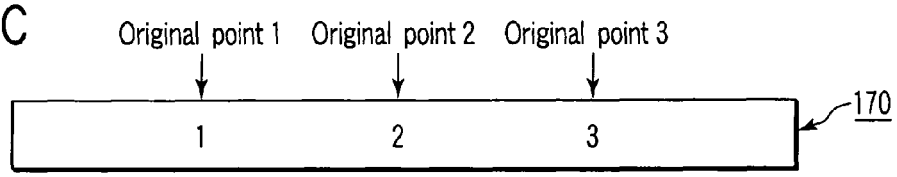
Figure 33:
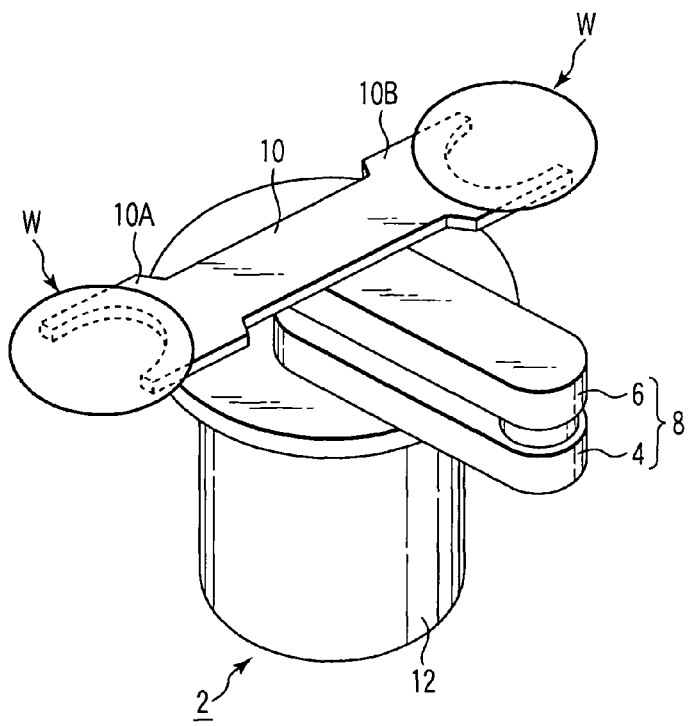
FIG. 33 is a perspective view showing an example of a conventional transfer apparatus.

FIGS. 32C and 32D show the detection patterns 170 of cases where the detection structure is used as a position sensor. In the case of FIG. 32C, three different figures, i.e., "★", "●", and "▲", are arranged. In the case of FIG. 32D, characters "1", "2", and "3" are arranged as figures. With each of these detection patterns 170, the three positions can be detected from a difference in figure. In the cases of FIGS. 32C and 32D, original point 1, original point 2, and original point 3 respectively correspond to the respective marks from the left. Desired bent or stretched states of the respective arm mechanisms 26 and 28 can be assigned to the respective original points 1 to 3.

The above driving mechanism is exemplified by a coaxial two-shaft structure. The present invention can also be applied to a case employing a driving mechanism having a three or more shafts. In the embodiments described above, a semiconductor wafer is used as a target substrate. However, the present invention is not limited to this, but can also be applied to a case wherein a glass substrate, an LCD substrate, and the like are to be transferred.

INDUSTRIAL APPLICABILITY

According to the present invention, a transfer apparatus can be provided in which a base needs to be pivoted through only a small pivot angle when exchanging target substrates. According to the present invention, a driving mechanism can be provided which can detect the positional relationship among a plurality of driving shafts relative to each other without using an encoder or the like.

The invention claimed is:

1. A transfer apparatus for target substrates, comprising:
   a rotary base rotatable integrally with a rotary shaft;
   first and second arm mechanisms configured to bend and stretch, each of the first and second arm mechanisms including a proximal end arm attached to the rotary base, an intermediate arm, and a pick which are pivotally coupled to each other sequentially from the rotary base, and each of the picks being disposed to support a separate one of the target substrates;
   a link mechanism coupling the proximal end arms of the first and second arm mechanisms to each other to drive and interlock the first and second arm mechanisms, the link mechanism including a driving link and first and second driven links which respectively couple the driving link directly to the proximal end arms of the first and second arm mechanisms;
   a first driving mechanism which rotates the rotary base, the first driving mechanism including a first motor that provides a driving force for rotating the rotary base and a first transmission part that transmits the driving force of the first motor to the rotary shaft; and
   a second driving mechanism which drives the link mechanism so as to bend or stretch the first and second arm mechanisms in conjunction with each other, the second driving mechanism including a single second motor common to the first and second arm mechanisms and providing a driving force for swinging the link mechanism and a second transmission part that transmits the driving force of the second motor to the driving link.

2. The apparatus according to claim 1, wherein the link mechanism is configured to interlock the first and second arm mechanisms such that, when one of the first and second arm mechanisms is substantially in an extended state, the remaining one is substantially in a contracted state.

3. The apparatus according to claim 1, wherein the driving link is rotatable integrally with a pivot shaft that is rotatably supported by the rotary base, and the second transmission part transmits the driving force of the second motor to the pivot shaft.

4. The apparatus according to claim 3, wherein the pivot shaft of the driving link is arranged inside the rotary shaft of the rotary base to be coaxial with the rotary shaft.

5. The apparatus according to claim 3, wherein the pivot shaft of the driving link is arranged at a position shifted from the rotary shaft of the rotary base.

6. The apparatus according to claim 1, wherein the driving link substantially includes a single link lever.

7. The apparatus according to claim 1, wherein the driving link includes a plurality of link levers that are coupled to each other.

8. The apparatus according to claim 1, wherein the first driven link is axially supported by the driving link on a second arm mechanism side across a center line, and the second driven link is axially supported by the driving link on a first arm mechanism side across the center line, the center line being a perpendicular bisector of a line segment that connects centers of the picks of the first and second arm mechanisms in an initial state where both the first and second arm mechanisms are contracted.

9. The apparatus according to claim 8, wherein the first and second driven links are arranged at different height levels and intersect each other.

10. The apparatus according to claim 3, wherein the second motor is a rotary motor including a rotary output shaft, and the second transmission part couples the rotary output shaft to the pivot shaft.

11. The apparatus according to claim 1, wherein the second motor is a linear motor including a reciprocation body, and the second transmission part couples the reciprocation body to the driving link.

12. The apparatus according to claim 1, wherein the proximal end arms of the first and second arm mechanisms are rotatably supported on the rotary base about shafts which are spaced apart from each other on one plane.

13. The apparatus according to claim 12, wherein the picks of the first and second arm mechanisms are arranged to face in different directions on one plane, and an open angle of the picks is set within a range of 60° to 180°.

14. The apparatus according to claim 1, wherein the proximal end arms of the first and second arm mechanisms are supported on the rotary base to vertically overlap and be rotatable about one axis as a center.

15. The apparatus according to claim 14, wherein the picks of the first and second arm mechanisms are arranged to vertically overlap and face in one direction.

16. The apparatus according to claim 1, wherein the first and second motors respectively include first and second rotary output shafts formed of hollow pipes and arranged to be coaxial with each other such that the second rotary output shaft is disposed inside the first rotary output shaft, and
the apparatus further comprises a detecting mechanism configured to detect a rotational position, the detecting mechanism comprising:
a detection pattern disposed on an inner surface of the first rotary output shaft;
a light emitting portion for irradiating the detection pattern with light;
a light-transmitting window disposed on the second rotary output shaft to receive reflected light from the detection pattern;
a reflection member configured to reflect the light passing through the light-transmitting window in an axial direction of the second rotary output driving shaft;
a light-receiving portion which receives the light reflected by the reflection member; and
a position detector configured to obtain a positional relationship in a rotational direction between the inner and first rotary output shafts based on an output from the light-receiving portion.

17. The apparatus according to claim 16,
wherein the light-emitting portion is configured to emit light in the axial direction of the second rotary output shaft; and
the reflection member is configured to reflect the light from the light-emitting portion in a radial direction to irradiate the detection pattern with the reflected light through the light-transmitting window.

18. The apparatus according to claim 16, wherein the light-receiving portion includes an image sensor configured to detect an image of the detection pattern.

19. The apparatus according to claim 18,
wherein the light emitting portion is configured to irradiate the detection pattern with illumination light.

20. The apparatus according to claim 18, wherein the detection pattern includes an array of different color regions.

21. The apparatus according to claim 18, wherein the detection pattern includes an array of different figures.

22. The apparatus according to claim 18, wherein the detection pattern includes an array of regions having different lightness levels.

23. The apparatus according to claim 1, wherein the apparatus is preset such that the first arm mechanism or the second arm mechanism is stretched while the first motor is stopped and the second motor is operated.

24. The apparatus according to claim 4, wherein the first and second motors respectively include first and second rotary output shafts arranged to be coaxial with each other such that the second rotary output shaft is disposed inside the first rotary output shaft, and the first and second transmission parts are portions that integrate the first and second rotary output shafts with the rotary shaft and the pivot shaft, respectively.

25. The apparatus according to claim 5, wherein the first and second motors respectively include first and second rotary output shafts arranged to be coaxial with each other such that the second rotary output shaft is disposed inside the first rotary output shaft, the second rotary output shaft is rotatably supported by the rotary base, the first transmission part is a portion that integrates the first rotary output shaft with the rotary shaft, and the second transmission part comprises transmission components disposed inside the rotary base to couple the second rotary output shaft to the pivot shaft.

26. The apparatus according to claim 1, wherein each of the first and second arm mechanisms is structured such that the proximal end arm is provided with a proximal end arm transmission part disposed therein and configured to transmit a force, generated by a swing of the proximal end arm relative to the rotary base, to the intermediate arm as a force for the intermediate arm to swing relative to the proximal end arm, and the intermediate arm is provided with an intermediate arm transmission part disposed therein and configured to transmit a force, generated by a swing of the intermediate arm relative to the proximal end arm to the pick as a force for the pick to swing relative to the intermediate arm.

27. The apparatus according to claim 26, wherein each of the first and second arm mechanisms is configured to bend and stretch while the pick retreats and advances in one direction.

28. The apparatus according to claim 1, wherein the first and second arm mechanisms and the link mechanism are disposed in a transfer chamber, and the first and second motors are disposed in a casing hermetically sealed from the transfer chamber.

29. A transfer apparatus for target substrates, comprising:
a rotary base rotatable integrally with a rotary shaft;
first and second arm mechanisms configured to bend and stretch, each of the first and second arm mechanisms including a proximal end arm attached to the rotary base, an intermediate arm, and a pick which are pivotally coupled to each other sequentially from the rotary base, and each of the picks being disposed to support a separate one of the target substrates;
a link mechanism coupling the proximal end arms of the first and second arm mechanisms to each other to drive and interlock the first and second arm mechanisms, the link mechanism including a driving link and first and second driven links which respectively couple the driving link directly to the proximal end arms of the first and second arm mechanisms, the driving link being rotatable integrally with a pivot shaft that is coaxial with the rotary shaft and rotatably supported by the rotary base;

a first driving mechanism which rotates the rotary base, the first driving mechanism including a first motor that provides a driving force for rotating the rotary base and a first transmission part that transmits the driving force of the first motor to the rotary shaft; and a second driving mechanism which drives the link mechanism so as to bend or stretch the first and second arm mechanisms in conjunction with each other, the second driving mechanism including a single second motor that is common to the first and second arm mechanisms and provides a driving force for swinging the link mechanism and a second transmission part that transmits the driving force of the second motor to the driving link.

* * * * *